US008969977B2

(12) United States Patent
Kono et al.

(10) Patent No.: US 8,969,977 B2
(45) Date of Patent: Mar. 3, 2015

(54) FLOW SENSOR, METHOD FOR MANUFACTURING FLOW SENSOR AND FLOW SENSOR MODULE

(75) Inventors: Tsutomu Kono, Kawasaki (JP); Yuuki Okamoto, Hitachinaka (JP); Takeshi Morino, Hitachinaka (JP); Keiji Hanzawa, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 1118 days.

(21) Appl. No.: 12/964,935

(22) Filed: Dec. 10, 2010

(65) Prior Publication Data
US 2011/0140211 A1    Jun. 16, 2011

(30) Foreign Application Priority Data
Dec. 11, 2009  (JP) .................................. 2009-282085

(51) Int. Cl.
H01L 29/84    (2006.01)
G01F 1/684   (2006.01)
G01F 1/692   (2006.01)

(52) U.S. Cl.
CPC .............. *G01F 1/6842* (2013.01); *G01F 1/684* (2013.01); *G01F 1/692* (2013.01);
(Continued)

(58) Field of Classification Search
CPC ....... G01F 1/684; G01F 1/6842; G01F 1/692; H01L 24/72; H01L 24/70; H01L 29/84; H01L 2224/72; H01L 2224/7592; H01L 2924/35
USPC ........... 257/415, E29.324, E21.499, E21.502, 257/E21.503, E21.504
See application file for complete search history.

(56) References Cited

U.S. PATENT DOCUMENTS 6,382,023 B1    5/2002  Yonezawa et al.
6,393,907 B1    5/2002  Yamakawa et al.
(Continued)

FOREIGN PATENT DOCUMENTS

EP    2 096 423 A2    9/2009
JP    9-158739 A      6/1997
(Continued)

OTHER PUBLICATIONS
Japanese Office Action dated May 15, 2012 (Three (3) pages).
European Search Report dated Jun. 6, 2011 (Eight (8) pages).
English translation of Japanese Office Action dated May 15, 2012, previously filed and cited as C2 (three (3) pages).
(Continued)

*Primary Examiner* — Colleen A Matthews
*Assistant Examiner* — Colleen E Snow
(74) *Attorney, Agent, or Firm* — Crowell & Moring LLP

(57) ABSTRACT

The invention provides a flow sensor structure for sealing the surface of an electric control circuit and a part of a semiconductor device via a manufacturing method capable of preventing occurrence of flash or chip crack when clamping the semiconductor device via a mold. The invention provides a flow sensor structure comprising a semiconductor device having an air flow sensing unit and a diaphragm formed thereto, and a board or a lead frame having an electric control circuit for controlling the semiconductor device disposed thereto, wherein a surface of the electric control circuit and a part of a surface of the semiconductor device is covered with resin while having the air flow sensing unit portion exposed. The invention further provides flow sensor structure in which surfaces of a resin mold, a board or a pre-mold component surrounding the semiconductor device are continuously not in contact with three walls of the semiconductor device orthogonal to a side on which the air flow sensing unit portion is disposed, or a manufacturing method for absorbing the dimensional variation of the semiconductor device by the deformation of springs or deformation of an elastic film in the thickness direction.

9 Claims, 33 Drawing Sheets

(52) U.S. Cl.
CPC ........... *H01L 2224/48091* (2013.01); *H01L 2224/48227* (2013.01); *H01L 2224/49171* (2013.01); *H01L 2224/73265* (2013.01); *H01L 2224/45144* (2013.01)
USPC ........... 257/415; 257/E29.324; 257/E21.502; 257/E21.503; 257/E21.504

(56) References Cited

U.S. PATENT DOCUMENTS

| | | | |
|---|---|---|---|
| 7,437,927 B2 * | 10/2008 | Yamada et al. | 73/204.21 |
| 2004/0060354 A1 * | 4/2004 | Watanabe et al. | 73/204.22 |
| 2005/0279919 A1 | 12/2005 | Tanaka et al. | |
| 2008/0148842 A1 | 6/2008 | Oda | |
| 2009/0199632 A1 | 8/2009 | Toyoda | |

FOREIGN PATENT DOCUMENTS

| | | |
|---|---|---|
| JP | 11-6752 A | 1/1999 |
| JP | 2000-275076 A | 10/2000 |
| JP | 2001-91322 A | 4/2001 |
| JP | 2006-3260 A | 1/2006 |
| JP | 2006-293030 A | 10/2006 |
| JP | 2008-111668 A | 5/2008 |
| JP | 2008-175780 A | 7/2008 |
| JP | 2009-36639 A | 2/2009 |
| JP | 2009-192238 A | 8/2009 |

OTHER PUBLICATIONS

Japanese Office Action with English Translation dated Aug. 21, 2012 (five (5) pages).

* cited by examiner

A-A CROSS-SECTION

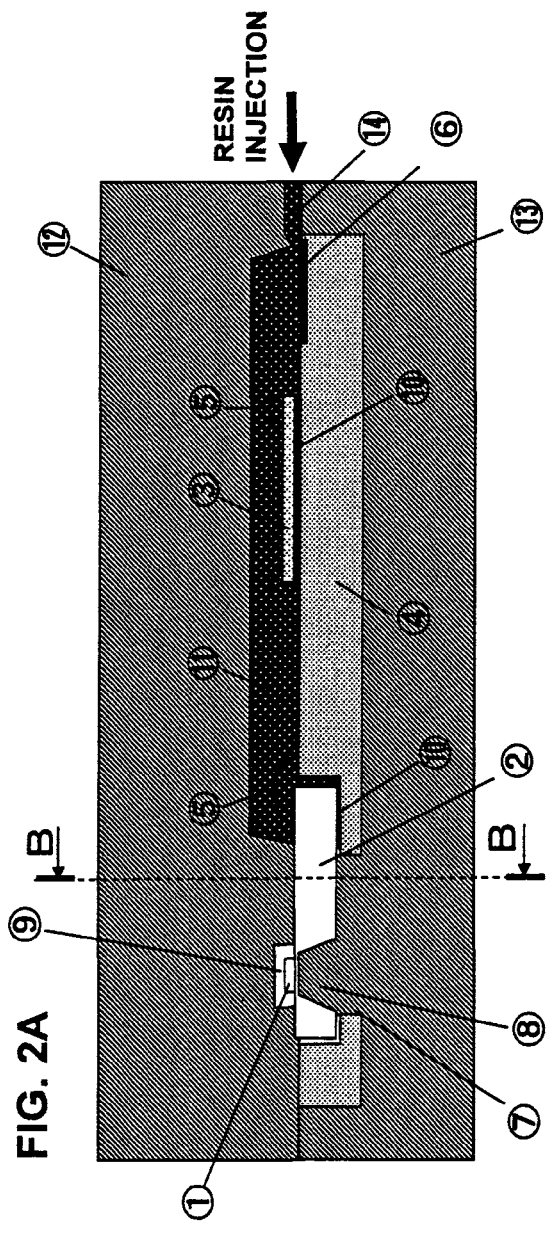

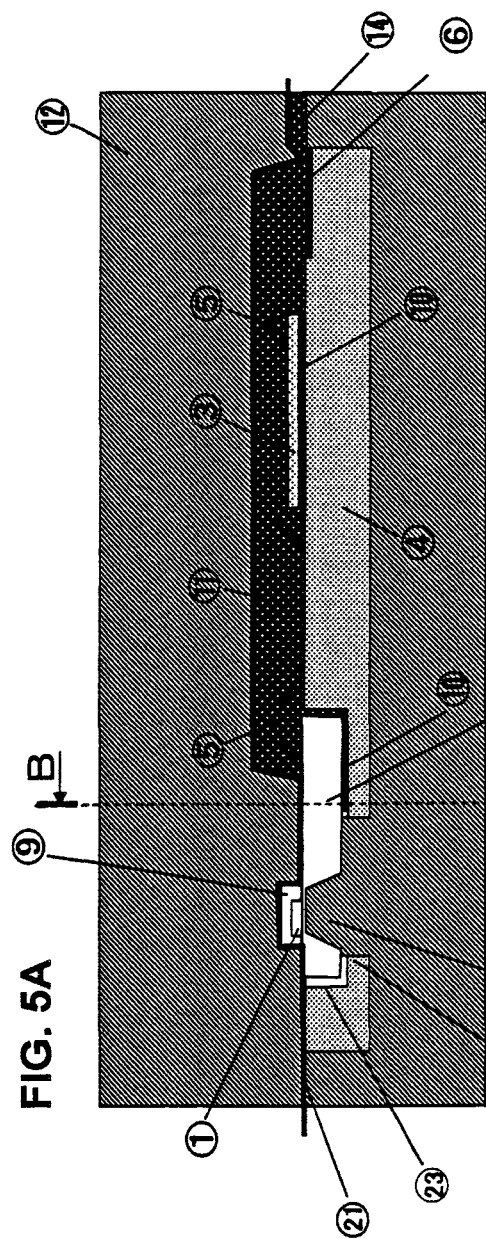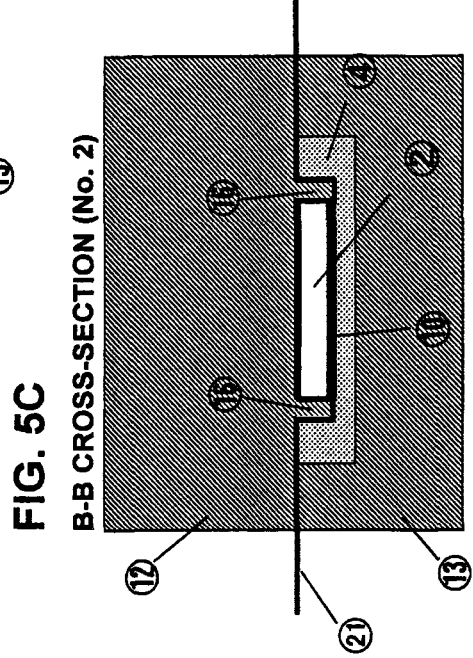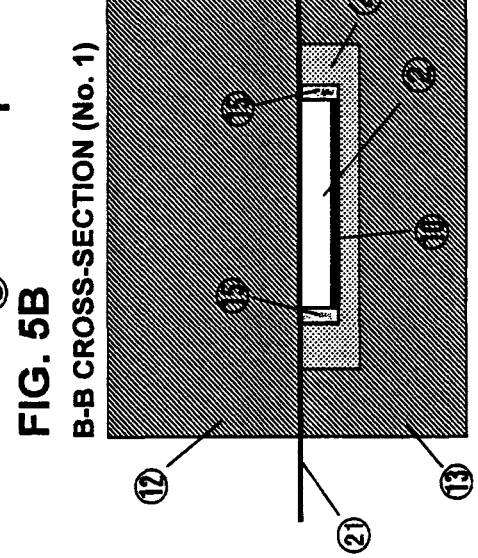

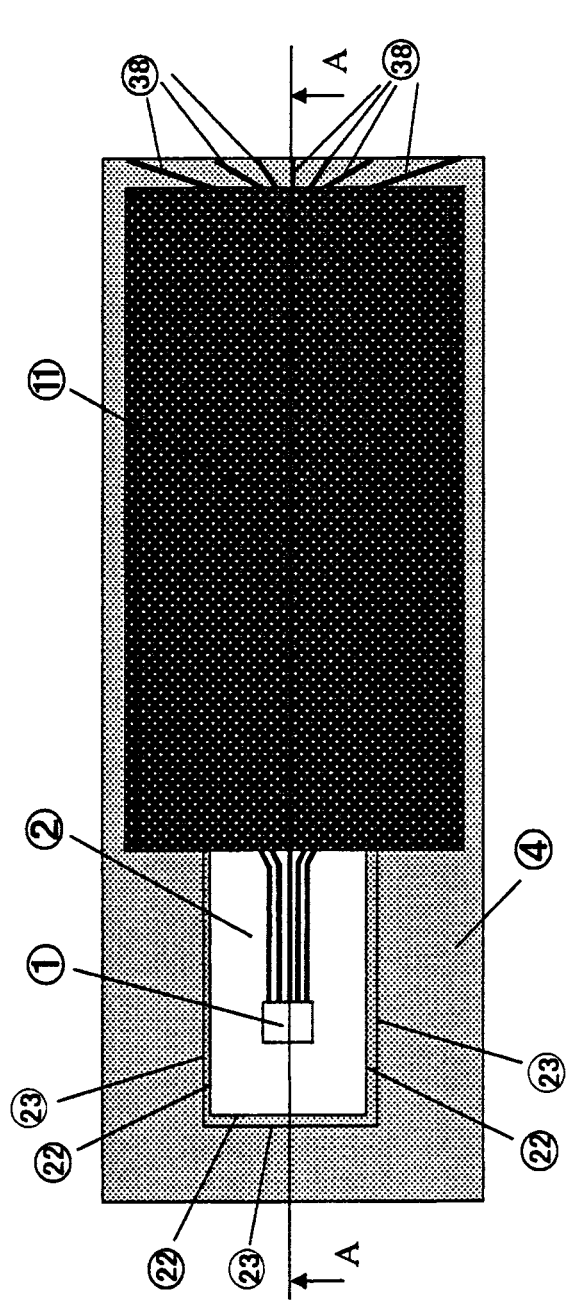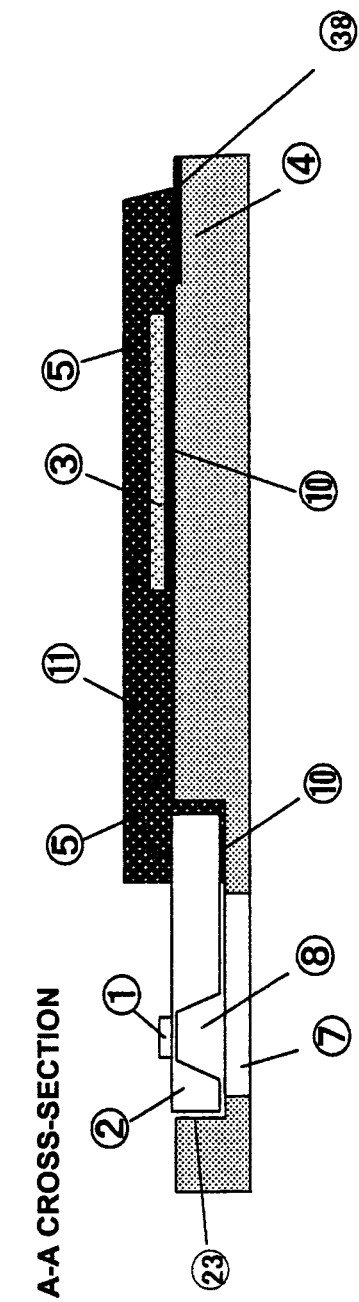
FIG. 7A
FIG. 7B A-A CROSS-SECTION

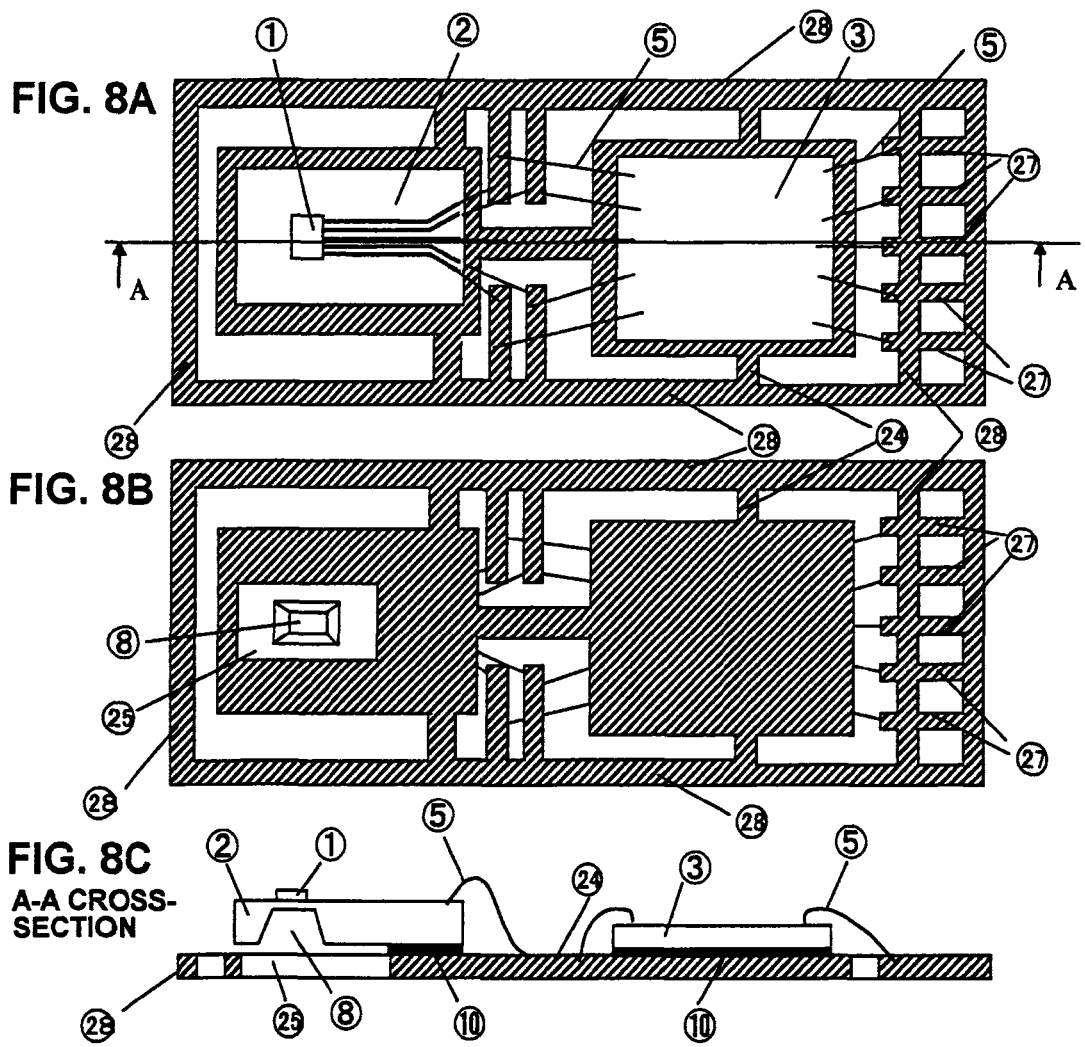

B-B CROSS-SECTION (No. 2)

B-B CROSS-SECTION (No. 1)

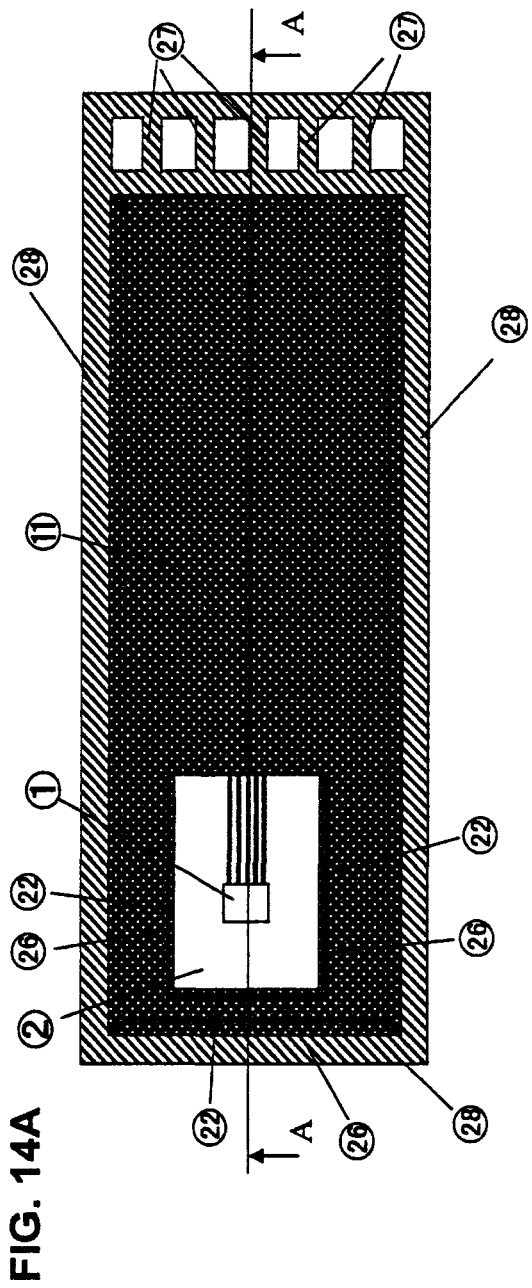
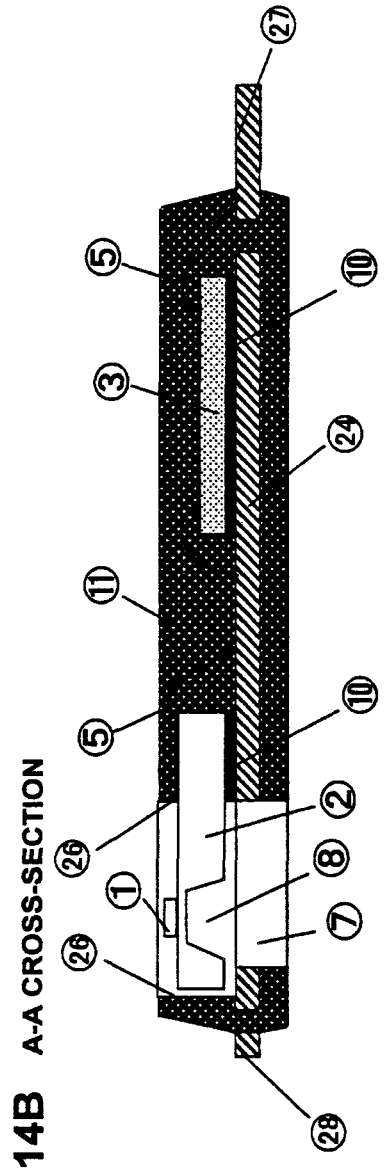
FIG. 14A
FIG. 14B A-A CROSS-SECTION

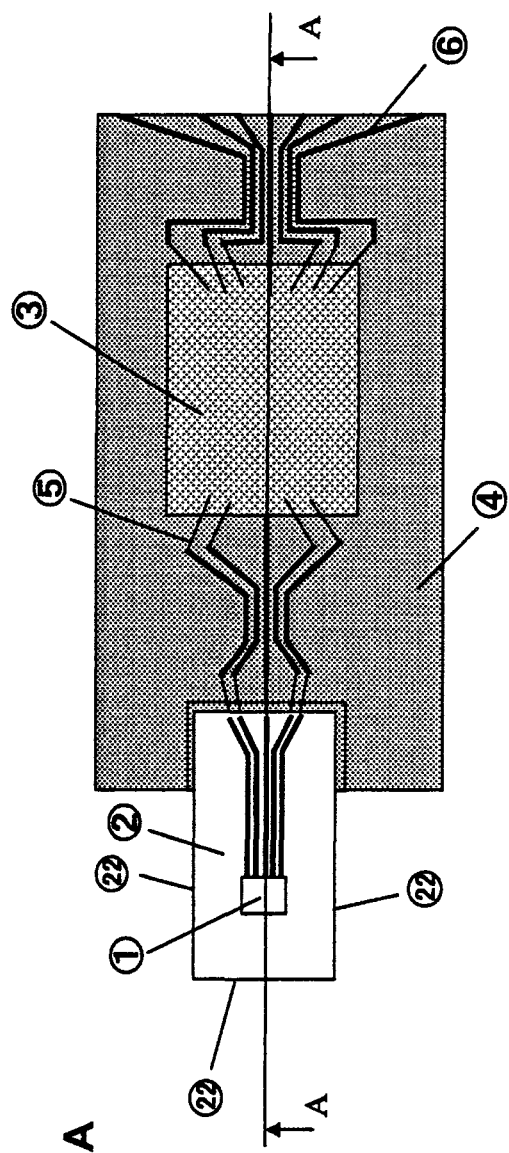
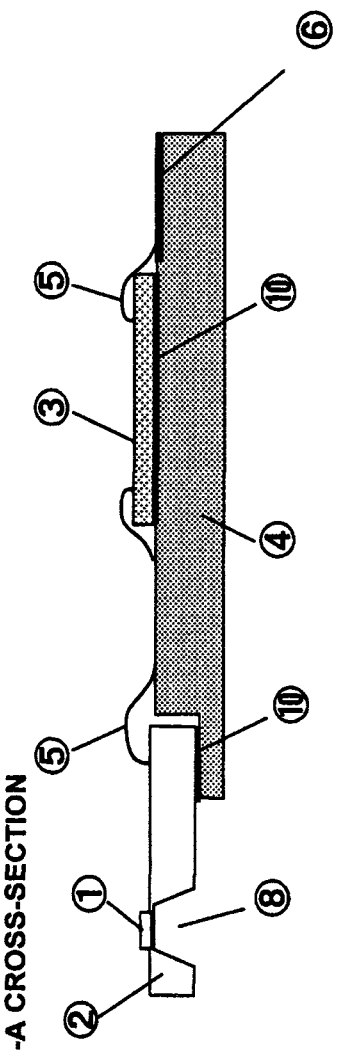
FIG. 16A
FIG. 16B
A-A CROSS-SECTION

A-A CROSS-SECTION

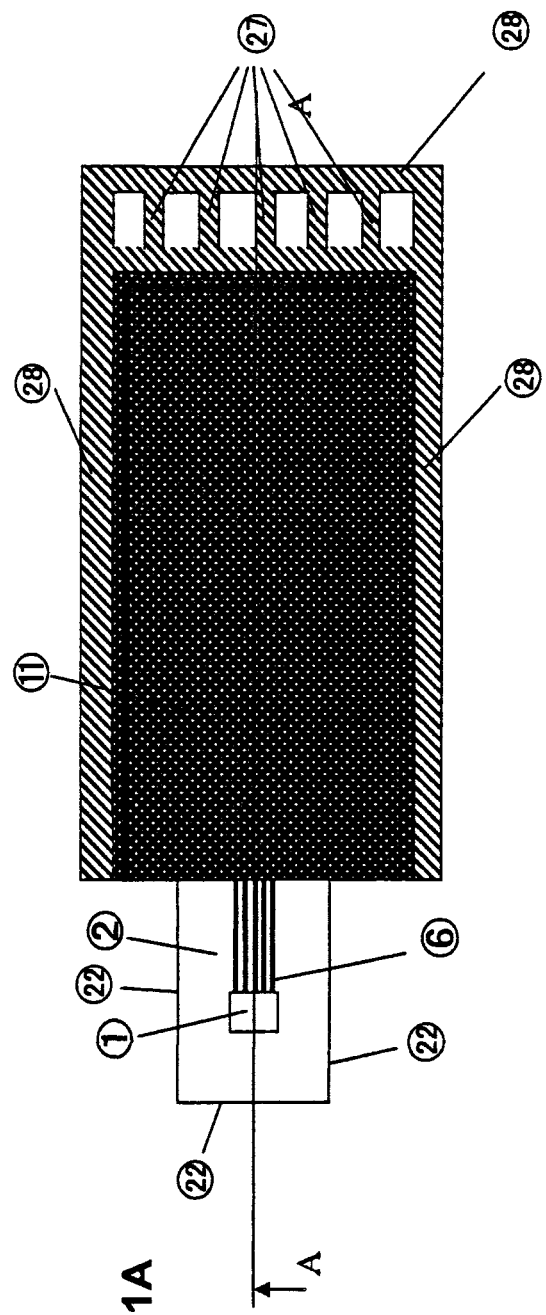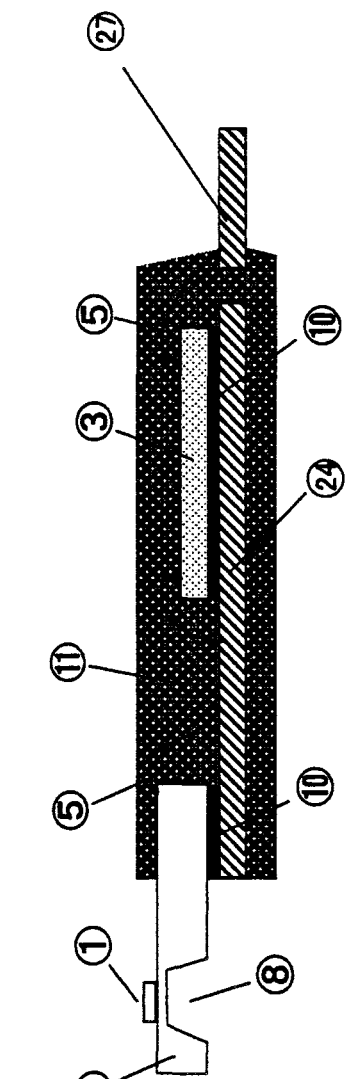
FIG. 21A
FIG. 21B

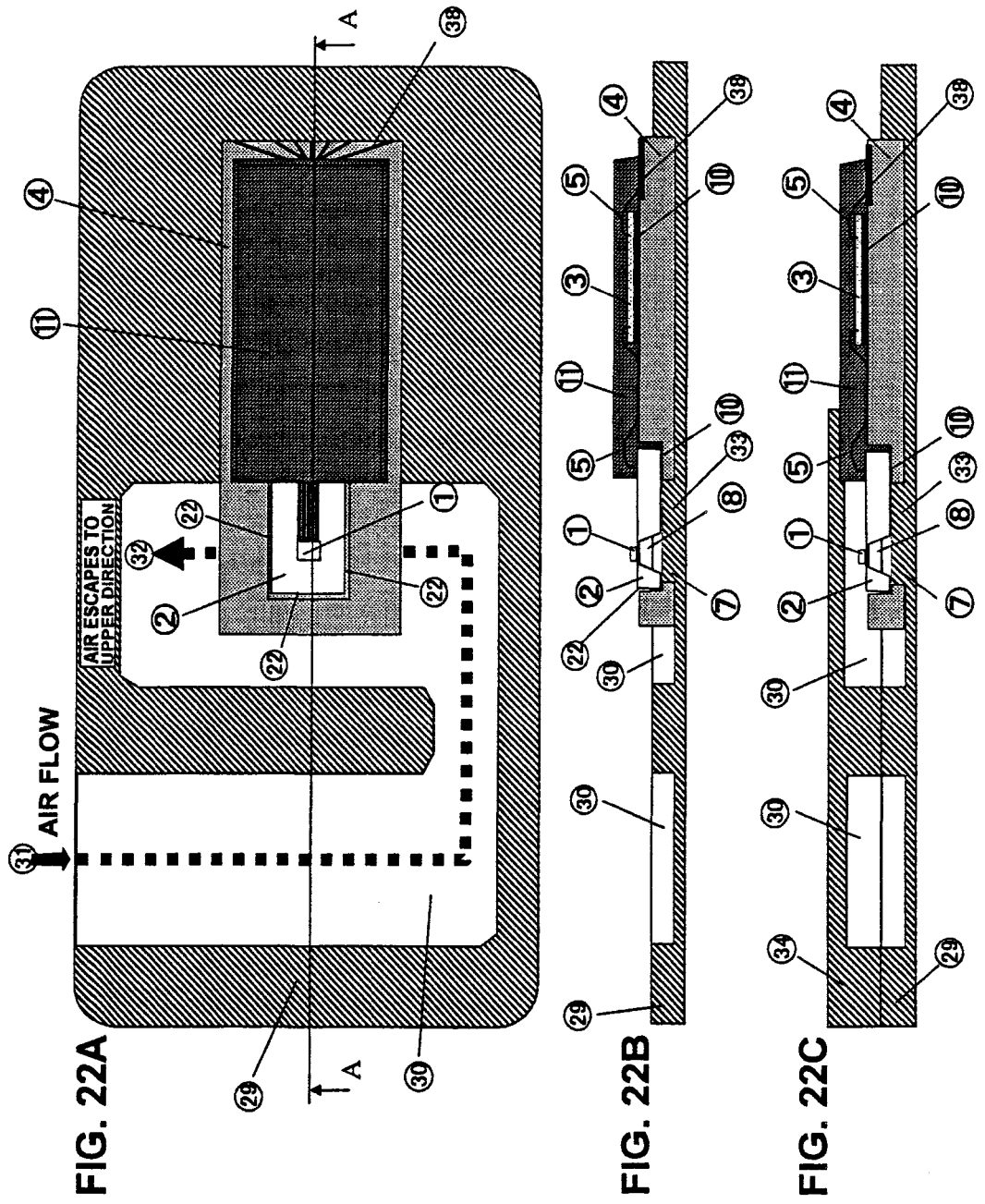

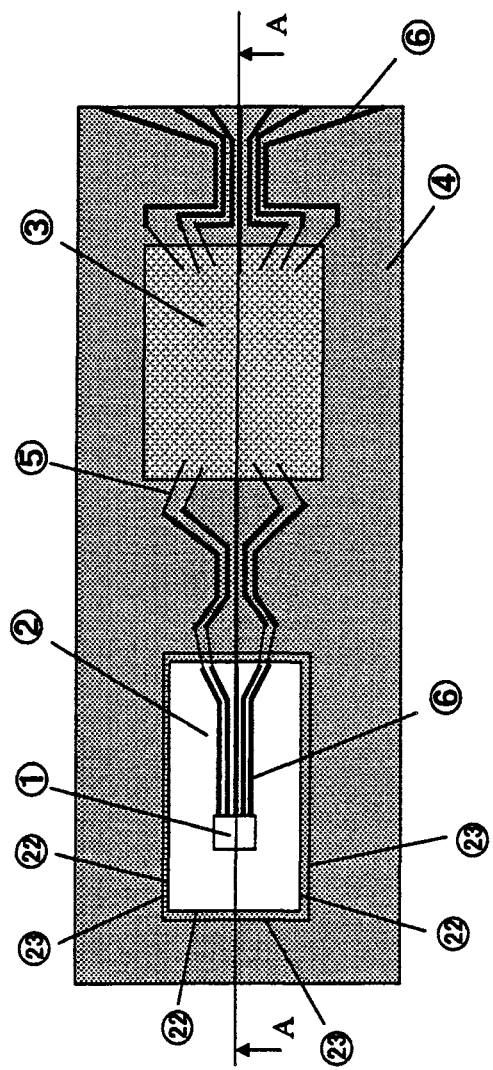
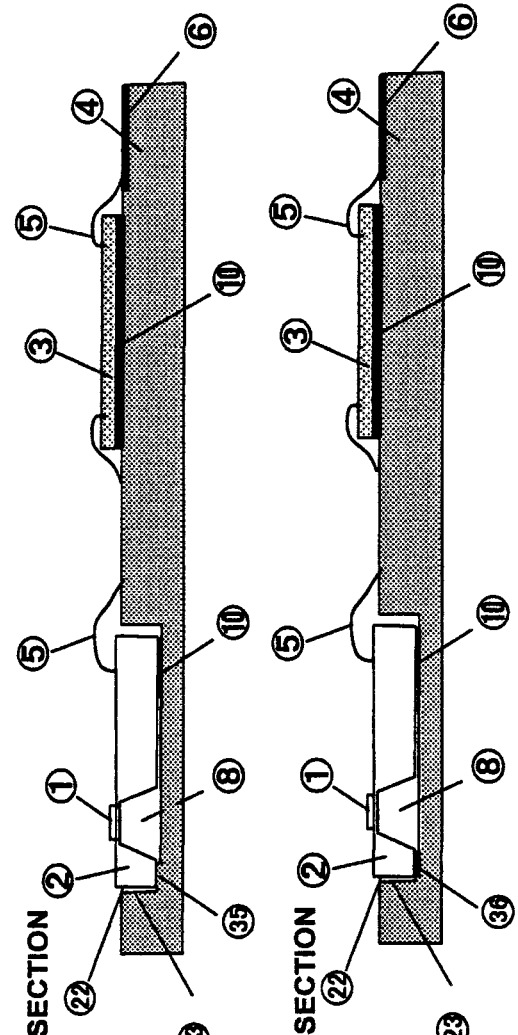
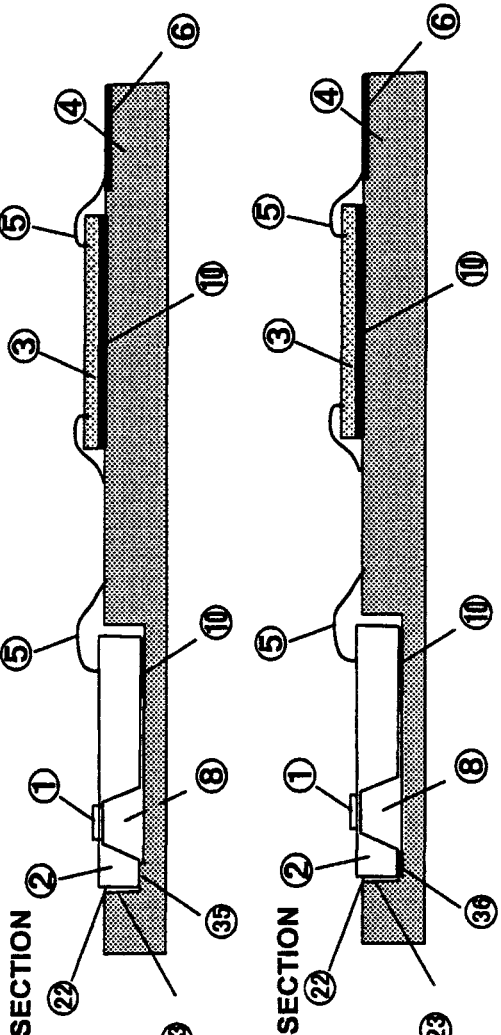
FIG. 23A
FIG. 23B
A-A CROSS-SECTION
FIG. 23C
A-A CROSS-SECTION

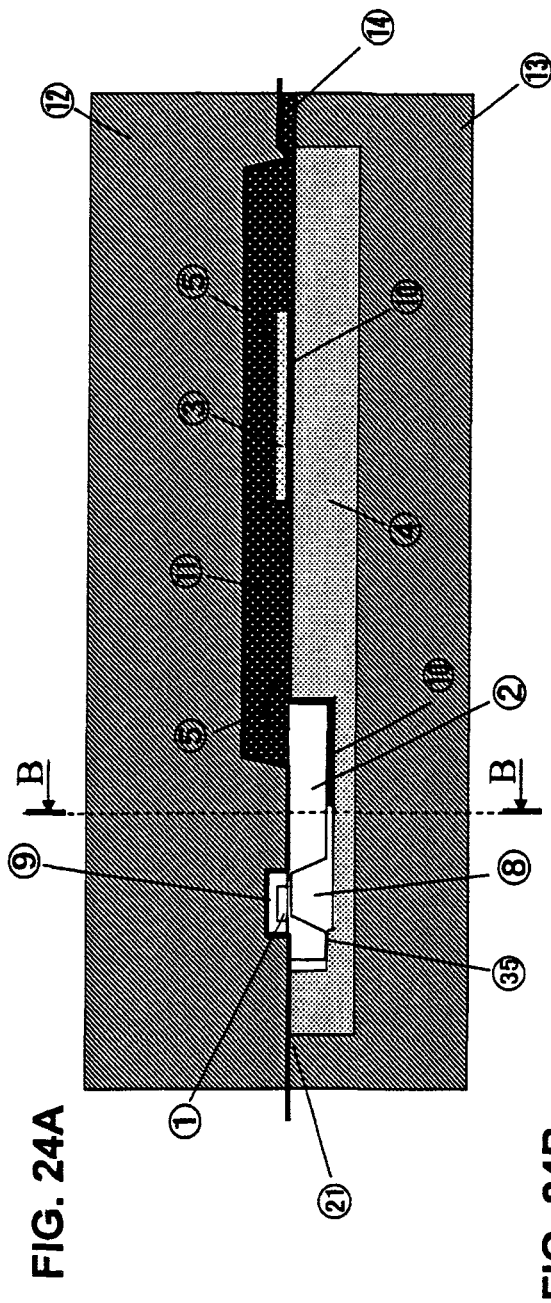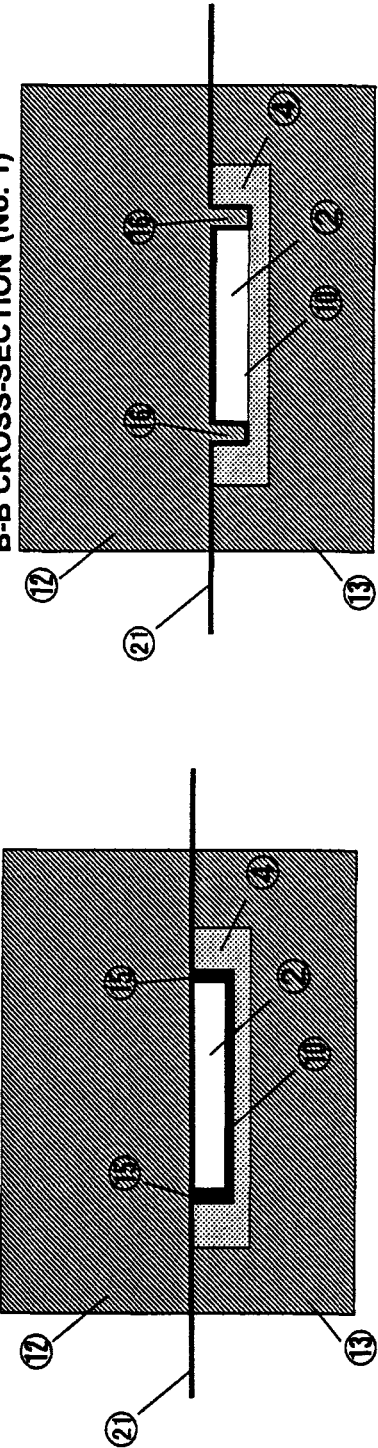
FIG. 24A
FIG. 24B
B-B CROSS-SECTION (No. 2)
FIG. 24C
B-B CROSS-SECTION (No. 1)

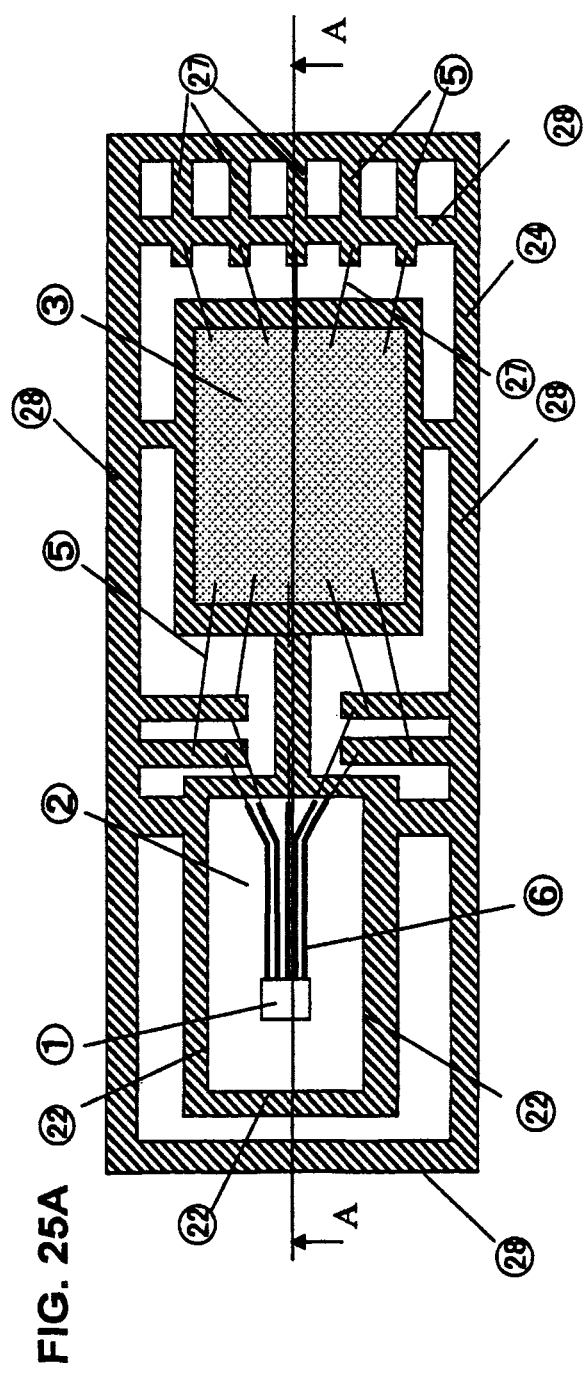
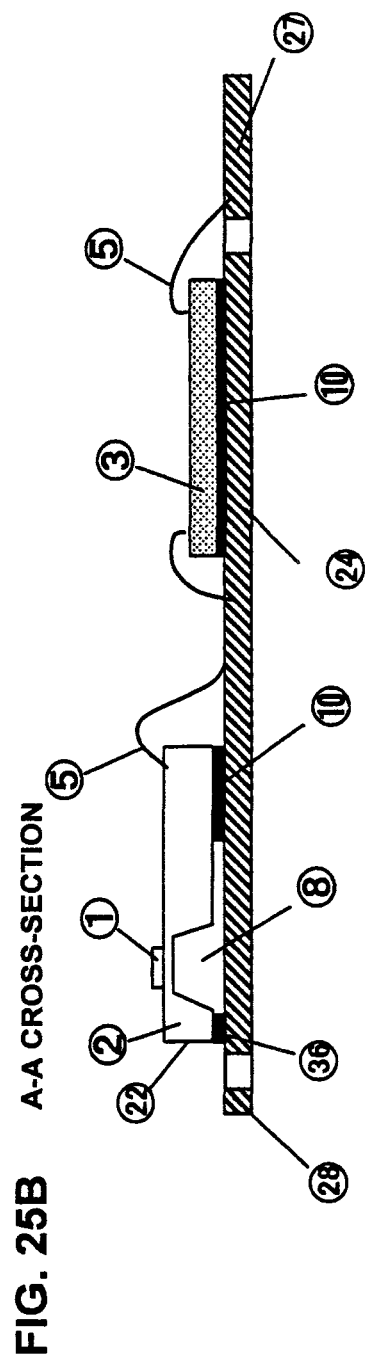
FIG. 25A
FIG. 25B A-A CROSS-SECTION

FIG. 27B A-A CROSS-SECTION

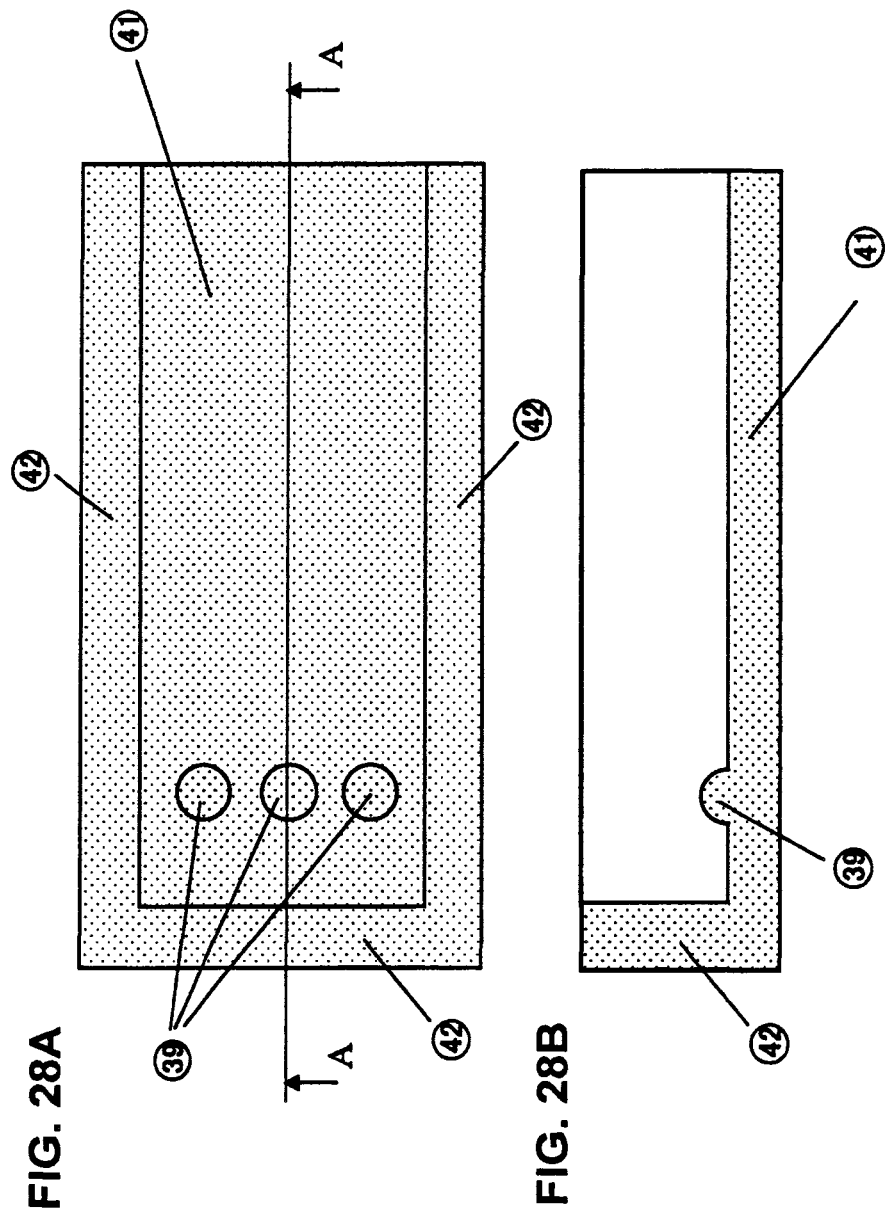

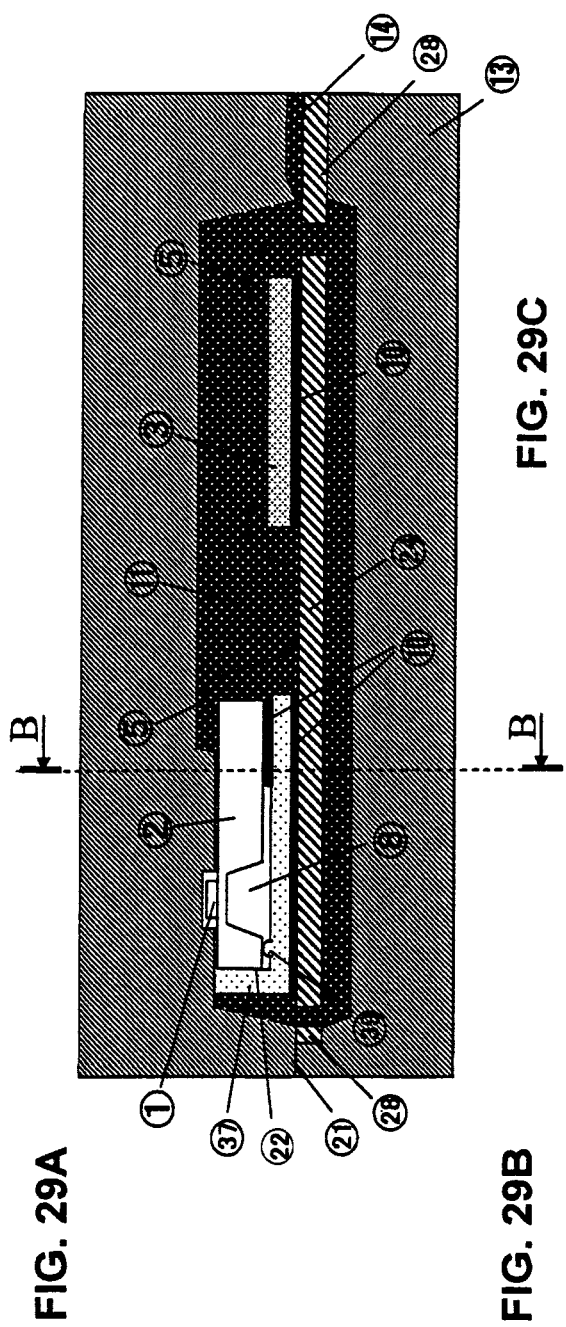
FIG. 29A
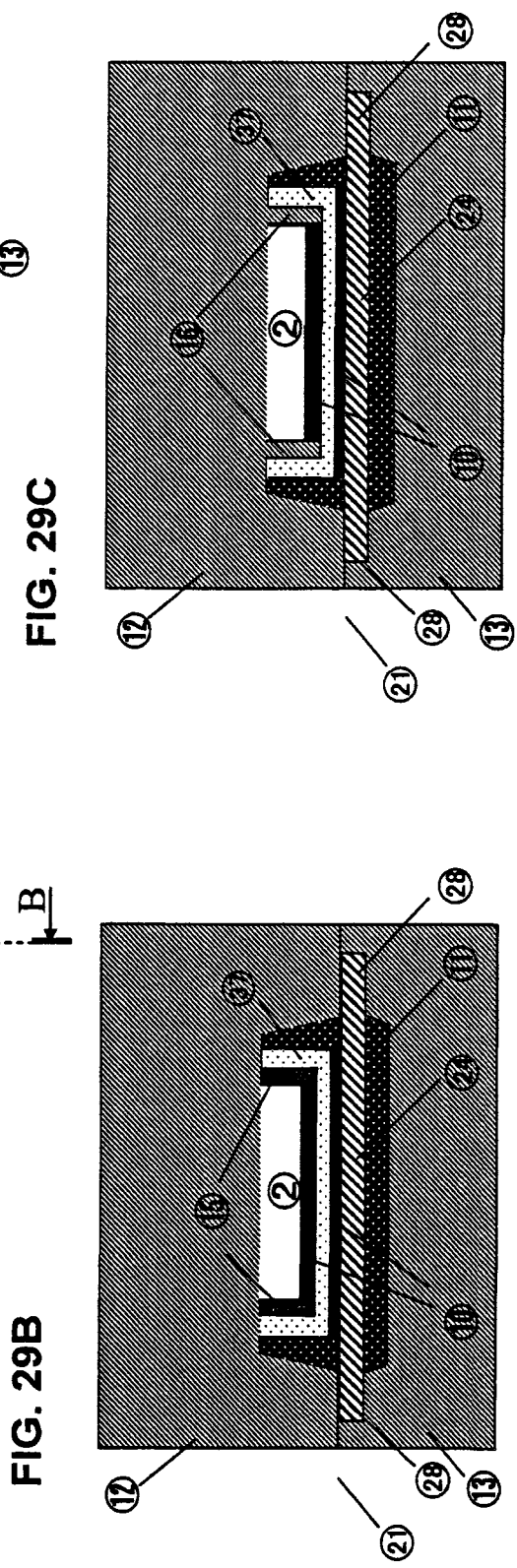
FIG. 29B
FIG. 29C

A-A CROSS-SECTION

SURFACE

A-A CROSS-SECTION

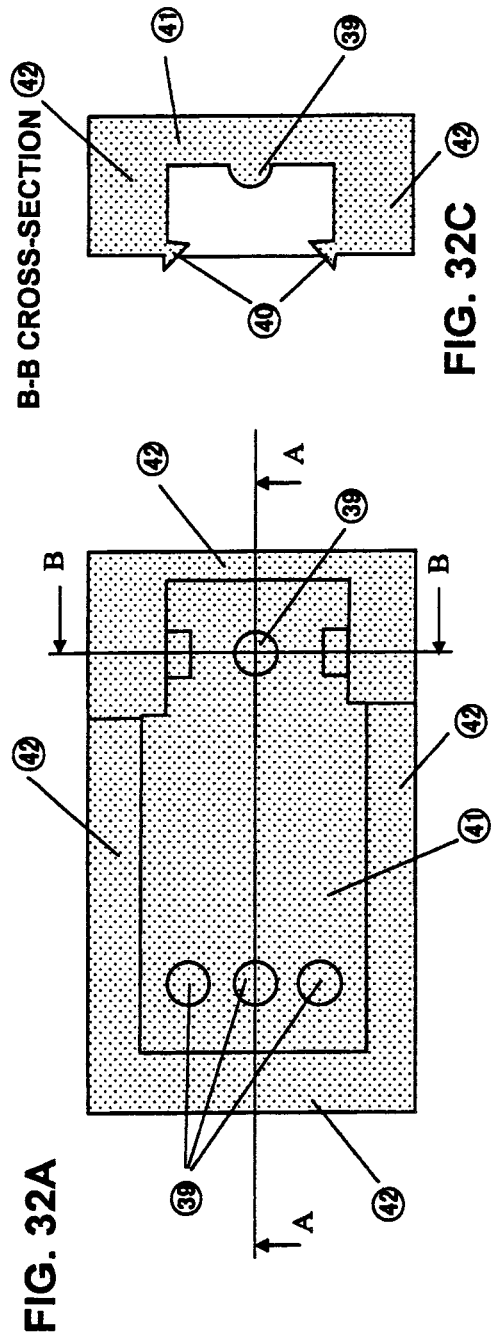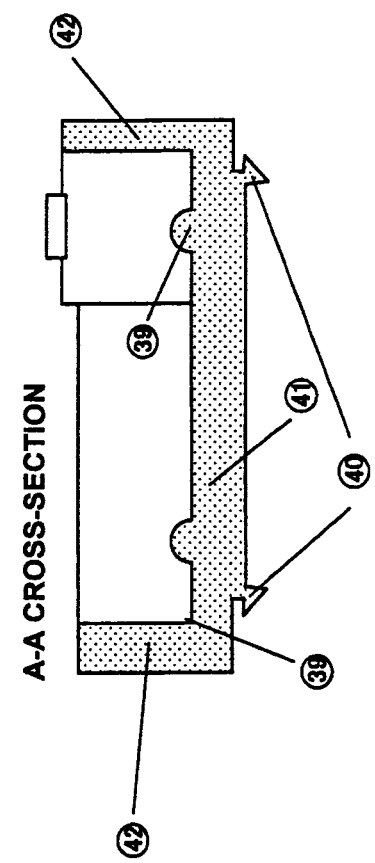
FIG. 32A
FIG. 32B A-A CROSS-SECTION
FIG. 32C B-B CROSS-SECTION

SURFACE

A-A CROSS-SECTION

FLOW SENSOR, METHOD FOR MANUFACTURING FLOW SENSOR AND FLOW SENSOR MODULE

The present application is based on and claims priority of Japanese patent application No. 2009-282085 filed on Dec. 11, 2009, the entire contents of which are hereby incorporated by reference.

BACKGROUND OF THE INVENTION

1. Field of the Invention

The present invention relates to a flow sensor, a method for manufacturing a flow sensor and a flow sensor module, comprising a semiconductor device having a flow sensing unit for sensing flow of air or other fluids and a diaphragm formed thereto, and a board or a lead frame having an electric control circuit for controlling the semiconductor device disposed thereto, wherein a surface of the electric control circuit and a part of a surface of the semiconductor device is covered with resin while the air flow sensing unit portion of the semiconductor device is exposed.

2. Description of the Related Art

In a conventional flow sensor composed of a semiconductor device equipped with an air flow sensing unit, an electric control circuit and a board, gold wires electrically connecting the semiconductor device and the board are protected and fixed via a potting resin. The fixing using the potting resin is normally performed without clamping the semiconductor device via molds or the like, so that the shrinkage of the potting resin may cause the semiconductor device to be displaced. Therefore, the fixing performed via the potting resin has a drawback in that the dimensional accuracy of the semiconductor device may be deteriorated. Further, since a relatively long time is required for curing the potting resin, the manufacturing costs become high.

This problem can be solved by providing a structure that molds and fixes the semiconductor device including the air flow sensing unit to the board or the lead frame with the air flow sensing unit portion exposed, instead of performing potting as in the prior art.

At this time, molding can be performed while clamping the semiconductor device via the mold so as to improve the positioning accuracy of the semiconductor device and the board after molding and to shorten the resin curing time by the heat transfer from the mold to the resin.

Patent documents 1 and 2 disclose known mold integrated structures in which the semiconductor device including the air flow sensing unit and the lead frame are molded integrally.

Patent document 1 (Japanese patent application laid-open publication No. 11-006752, Japanese patent application No. 9-158739) and patent document 2 (Japanese patent application laid-open publication No. 2008-111668, Japanese patent application No. 2006-293030) disclose a structure in which one end of a semiconductor sensor device not having a cavity section or a heating resistor is integrally molded with a lead frame.

According to the structure disclosed in patent documents 1 and 2, the area of a surface of the semiconductor device other than the air flow sensing unit is not surrounded via resin or a lead frame, so that the structure has a drawback in that the flow of air on the air flow sensing unit side cannot be detected accurately since air flows into the diaphragm having a narrow passage.

Furthermore, upon manufacturing the structure disclosed in patent documents 1 and 2, during the process for placing the semiconductor device and the lead frame in a mold and integrally molding the same via resin, the semiconductor device and the lead frame must be clamped and fixed via the mold to prevent flash and to determine the position of the semiconductor device.

The structural drawback of patent documents 1 and 2 according to this manufacturing process is that when the semiconductor device is clamped via the mold, the dimensional variation of the semiconductor device or the adhesive for bonding the semiconductor device to the lead frame may cause flash or chip crack of the air flow sensing unit on the semiconductor device when the device is clamped via the mold.

The present invention aims at solving the problems mentioned above by providing a flow sensor structure in which surfaces of a resin mold, a board or a pre-mold component molded in advance surround the semiconductor device in such a manner that they are not in continuous contact with three walls of the semiconductor device orthogonal to a side on which the air flow sensing unit portion is disposed on the semiconductor device.

The present invention further provides a manufacturing method capable of absorbing the dimensional variation of the semiconductor device via the deformation of springs or deformation of an elastic film in the thickness direction by supporting an insert of a mold clamping the semiconductor device via springs or by disposing an elastic film on the surface of the mold. In other words, the present invention enables to prevent the occurrence of flash or chip crack even when the dimension of the semiconductor device is varied.

According to the conventional flow sensor, the gold wires electrically connecting the semiconductor device and the board are protected and fixed via potting resin. The fixture using potting resin is performed without clamping the semiconductor device via the mold or the like, so that the shrinkage of the potting resin may cause the semiconductor device to be displaced. Therefore, the fixture using potting resin not only deteriorates dimensional accuracy but also requires a long time for curing the potting resin, so that the costs related thereto become high.

The present problem can be solved by adopting a structure to fix the semiconductor device having the air flow sensing unit to the board or the lead frame via molding while having the air flow sensing unit exposed, instead of performing the prior art potting.

The problem of the structure for fixing the components via molding is to prevent air from flowing into the diaphragm portion having a narrow passage. The present invention provides a flow sensor structure in which the walls composed of a resin mold or a board or a pre-mold component molded in advance surrounds the semiconductor device without being in continuous contact with three walls of the semiconductor device orthogonal to a side of the semiconductor device on which the air flow sensing unit is disposed.

The problem to be solved related to the manufacturing method of the flow sensor is to prevent the occurrence of flash or chip crack of the semiconductor device when the device is clamped via the mold.

SUMMARY OF THE INVENTION

The present invention aims at solving the problems of the prior art by providing a flow sensor structure comprising a semiconductor device having an air flow sensing unit and a diaphragm formed thereto, and a board or a lead frame having an electric control circuit for controlling the semiconductor device disposed thereto, wherein a surface of the electric control circuit and a part of a surface of the semiconductor device is covered with resin while the air flow sensing unit is exposed therefrom.

At this time, the semiconductor device and the resin mold are not in contact with each other except for the area where the semiconductor device, the gold wires transmitting the electric signals from the semiconductor device and the board or the lead frame are integrally molded via resin.

In other words, the present invention provides a flow sensor structure in which the walls composed of a resin mold, a board or a pre-mold component molded in advance surround the semiconductor device without being in continuous contact with three walls of the semiconductor device orthogonal to the surface on which the air flow sensing unit is disposed on the semiconductor device.

When the two parallel sides of the semiconductor device orthogonal to the surface of the semiconductor device on which the air flow sensing unit is disposed contact the resin mold, stress may occur to the air flow sensing unit mounted on the semiconductor device due to the difference in linear expansion coefficients of the semiconductor device and the resin mold portion, according to which the air flow cannot be accurately measured.

The present invention further provides a method for manufacturing a flow sensor in which the dimensional variation of the semiconductor device can be absorbed via deformation of springs or via deformation of an elastic film in the thickness direction, by supporting a movable insert of the mold clamping the semiconductor device via springs or by disposing an elastic film on the surface of the mold. In other words, it becomes possible to prevent the occurrence of flash and chip crack even when the semiconductor device has dimensional variation.

When flash occurs to the air flow sensing unit formed on the semiconductor device, the air flow cannot be detected accurately.

The structures of a flow sensor and the method for manufacturing the same was described above, but the method according to the present invention is not restricted to manufacturing flow sensors, and can be applied to manufacturing components such as a humidity sensor in which the semiconductor device is sealed via resin with a portion of the semiconductor device exposed.

According to the present invention, the positioning accuracy of the semiconductor device can be improved by covering the gold wires electrically connecting the semiconductor device having the air flow sensing unit formed thereon and the board or the lead frame via a resin mold while clamping the components in a mold. Further, the heat transfer from the mold to the resin enables to shorten the curing time of resin and reduce the mold take time.

Further according to the present resin molding process, the dimensional variation of the semiconductor device can be absorbed via deformation of springs or deformation of an elastic film in the thickness direction by having the mold clamping the semiconductor device from above and below supported via springs or by disposing an elastic film on the surface of the mold. In other words, since the occurrence of flash or chip crack can be prevented even when the dimension of the semiconductor device is varied, the fabrication yield of the flow sensor can be improved.

BRIEF DESCRIPTION OF THE DRAWINGS

FIG. 2A shows a manufacturing method for sealing via resin in a mold a structure including a semiconductor device and a control board mounted on the board shown in FIG. 1, which is a cross-sectional view of the A-A cross-section of FIG. 1C in which the structure prior to molding of FIG. 1 is placed in a mold and subjected to molding;

FIG. 2B is a B-B cross-section of FIG. 2A;

FIG. 2C is a B-B cross-section of FIG. 2A;

FIG. 5A shows a manufacturing method using a mold for clamping the semiconductor device from above and below via an elastic film by disposing an elastic film on an upper mold in contact with the resin material supporting the semiconductor device via an insert of the mold through the opening of the board, which is a cross-sectional view of the A-A cross-section of FIG. 1C in which the structure prior to molding of FIG. 1 is placed in a mold and subjected to molding;

FIG. 5B is a B-B cross-section of FIG. 5A;

FIG. 5C is a B-B cross-section of FIG. 5A;

FIG. 7A is a plan view of a flow sensor formed by molding a structure including the semiconductor device and the control board prior to molding illustrated in FIG. 1 in a mold shown in FIG. 3;

FIG. 7B is an A-A cross-section of FIG. 7A;

FIG. 8A is a plan view of the structure of a flow sensor using a lead frame prior to molding;

FIG. 8B is a plan view of the rear side of FIG. 8A;

FIG. 8C is an A-A cross-section of FIG. 8A;

FIG. 14A is a plan view of a structure formed by molding the structure including the semiconductor device and the control board prior to molding shown in FIG. 8 in the mold shown in FIG. 10;

FIG. 14B is an A-A cross-section of FIG. 14A;

FIG. 16A is a plan view of a flow sensor structure prior to molding having the semiconductor device including the air flow sensing unit and the diaphragm exposed from the end portion of the board, which shows the surface of the flow sensor prior to molding;

FIG. 16B is an A-A cross-section of FIG. 16A;

FIG. 21A is a plan view of a structure in which the structure including the semiconductor device and the control board prior to molding shown in FIG. 19 is molded in the mold shown in FIG. 20;

FIG. 21B is an A-A cross-section of FIG. 21A;

FIG. 22A is a plan view of a structure in which the flow sensor of FIG. 7 sealed via resin is disposed in a structure having an air passage;

FIG. 22B is an A-A cross-section of FIG. 22A;

FIG. 22C is a cross-sectional view in which a cover is disposed above a structure in which a flow sensor is disposed in an air passage shown in the cross-section of FIG. 22B;

FIG. 23A is a plan view showing a surface of a flow sensor prior to molding comprising a board having a semiconductor device including an air flow sensing unit and a diaphragm formed thereto and an electric control circuit 3 for controlling the semiconductor device disposed thereon, wherein the semiconductor device is mounted in a stepped portion and the stepped portion of the board on which the semiconductor device is disposed has a varied thickness;

FIG. 23B is an A-A cross-section of FIG. 23A;

FIG. 23C is a second embodiment of the A-A cross-section of FIG. 23A;

FIG. 24A shows a molding method in which the structure prior to molding of the A-A cross-section of FIG. 23B is placed in a mold and subjected to molding;

FIG. 24B is a B-B cross-section of FIG. 23A;

FIG. 24C is a B-B cross-section of FIG. 23A;

FIG. 25A is a plan view showing a surface of a flow sensor prior to molding comprising a lead frame having a semiconductor device including an air flow sensing unit and a diaphragm formed thereto and an electric control circuit 3 for controlling the semiconductor device disposed thereon, wherein a portion of the semiconductor device and the lead frame are supported via a spacer and in contact with each other;

FIG. 25B is an A-A cross-section of FIG. 25A;

FIG. 27B is an A-A cross-section of FIG. 27A;

FIG. 28A is a plan view showing the structure of a pre-mold component formed of resin;

FIG. 28B is an A-A cross-section of FIG. 28A;

FIG. 29A is a cross-sectional view of a manufacturing method for placing the structure prior to molding shown in the A-A cross-section of FIG. 27B in a mold and molding the same;

FIG. 29B is a B-B cross-section of FIG. 29A;

FIG. 29C is a B-B cross-section of FIG. 29A;

FIG. 32A is a plan view of a structure of a pre-mold component shown in FIG. 31 formed of resin;

FIG. 32B is an A-A cross-section of FIG. 32A;

FIG. 32C is a B-B cross-section of FIG. 32A;

DETAILED DESCRIPTION OF THE PREFERRED EMBODIMENTS

Figure 1A:
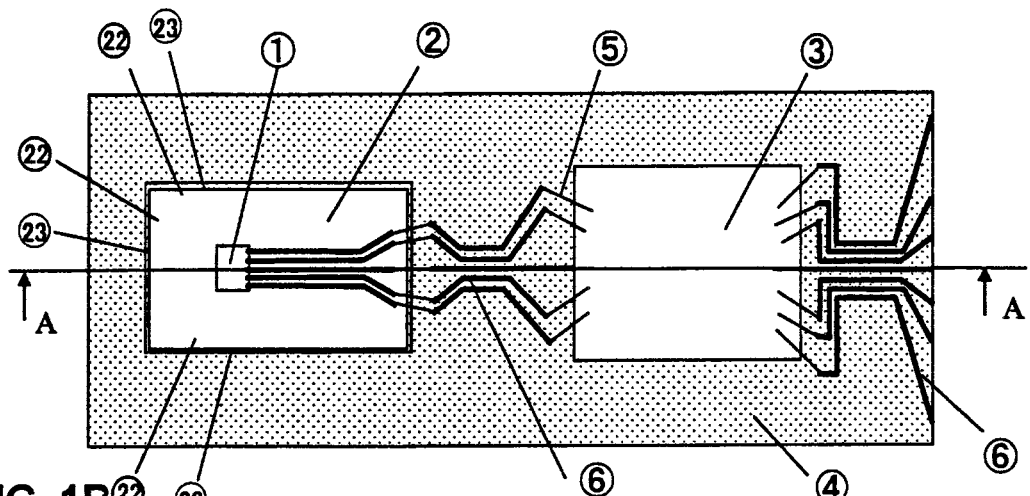
FIG. 1A is a plan view of a structure of a flow sensor on a board prior to molding.
Figure 1B:
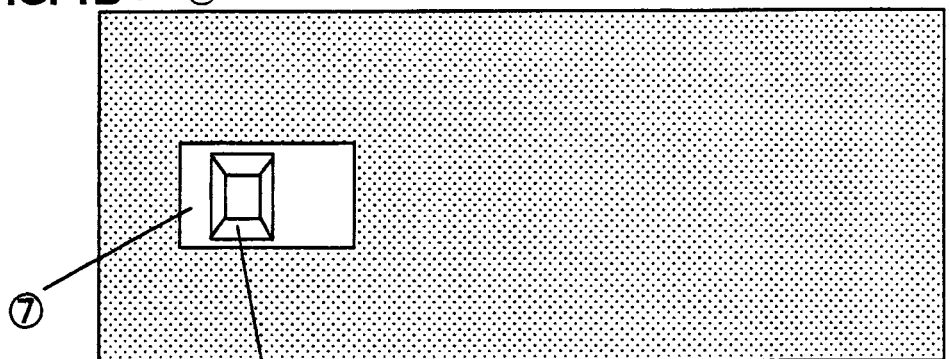
FIG. 1B is a plan view of a rear side of FIG. 1A.

Now, the preferred embodiments of the present invention will be described with reference to the accompanying drawings. FIG. 1A shows a plan view of a flow sensor prior to molding. FIG. 1B shows a plan view of a rear side of FIG. 1A, and FIG. 1C is an A-A cross-section of FIG. 1A.

Figure 1C:
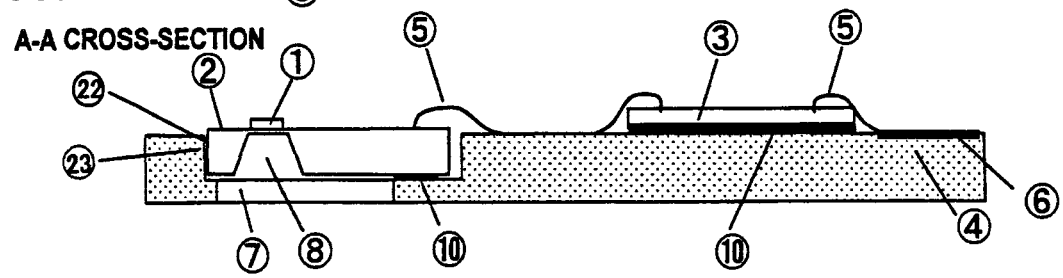
FIG. 1C is an A-A cross-section of FIG. 1A.

As shown in FIGS. 1A, 1B and 1C, the flow sensor prior to molding comprises a semiconductor device 2 having formed thereon an air flow sensing unit 1 and a diaphragm 8, and a board 4 having an opening with a stepped portion 7 arranged on one side and an electric control circuit 3 for controlling the semiconductor device 2 arranged on the other side, wherein the semiconductor device 2 is mounted on the stepped portion formed in the opening 7, and electric signals are transmitted via gold wires 5 and wirings 6 disposed on the board 4. Further, the electric control circuit 3 and the semiconductor device 2 are bonded via an adhesive 10 or the like to the board 4.

Now, the semiconductor device 2 includes at least a heating resistor and a resistance thermometer as the air flow sensing unit 1, wherein the electric control circuit 3 performs control so that the temperature of the heating resistor becomes higher by a certain temperature than the resistance thermometer corresponding to air temperature. When the temperature of the resistance thermometer is varied by air flow, the heating current supplied to the heating resistor to raise the temperature by a certain temperature is detected as flow.

The air flow sensing unit 1 is only required to include at least a heating resistor and a resistance thermometer, and should be capable of detecting the flow based on the temperature difference between the upstream side and the downstream side of air flow of the resistance thermometer.

The heating resistor and the resistance thermometer are formed by creating a metal film formed for example of platinum or a semiconductor thin film formed for example of polycrystalline silicon via methods such as sputtering or CVD, and then processing the same via ion etching or the like.

A cavity for forming the diaphragm 8 for thermal insulation is formed on the semiconductor device 2 constituting the air flow sensing unit 1 via methods such as anisotropic etching.

Further, glass epoxy can be used as the material for the board 4, and thermosetting resin such as epoxy or phenol can be used as the material for the mold resin 11, or thermosetting resin such as polycarbonate or polyethylene terephtharate can be used having a filler material such as glass or mica mixed therein.

[Manufacturing Method]

Now, FIG. 2 shows a manufacturing method for subjecting a structure including a semiconductor device 2 mounted on the board 4 shown in FIG. 1 and the control board 4 to resin-sealing using a mold.

FIG. 2A is an A-A cross-section of FIG. 1, showing a cross-sectional view of the structure prior to molding of FIG. 1 placed in a mold and subjected to molding.

The dimensional accuracy of the semiconductor device 2 during molding can be improved by inserting a lower mold 13 to an opening 7 formed on the board 4, clamping the semiconductor device 2 from above and below via an upper mold 12 and a lower mold 13, and thereby fixing the semiconductor device.

Further, resin 11 can be filled through a gate 14 into the mold with a space 9 formed to the upper mold 12 so that the upper mold 12 does not contact the air flow sensing unit 1, according to which the electric control circuit 3, the gold wires 5 and a portion of the semiconductor device 2 can be sealed via the resin 11.

The B-B cross-section of FIG. 2A is either formed as shown in FIG. 2B or FIG. 2C. Here, the clearance between the semiconductor device 2 and the board 4 shown in the B-B cross-section should be blocked so as to stop the flow of resin 11 in order to prevent the resin 11 from reaching the diaphragm 8.

Resin 11 can be prevented from entering the clearance between the semiconductor device 2 and the board 4 in the B-B cross-section by disposing an elastic member 15 such as a Teflon block as illustrated in FIG. 2B or via an insert 16 disposed on the upper mold 12 as illustrated in FIG. 2C.

Now, since the semiconductor device 2 has varied dimensions, when carrying out the manufacturing method of FIG. 2, resin 11 will leak on the semiconductor device 2 if the dimension of the semiconductor device 2 is smaller than the mold clamp dimension, and the semiconductor device 2 may crack if the size of the semiconductor device 2 is greater than the mold clamp dimension.

Figure 3:
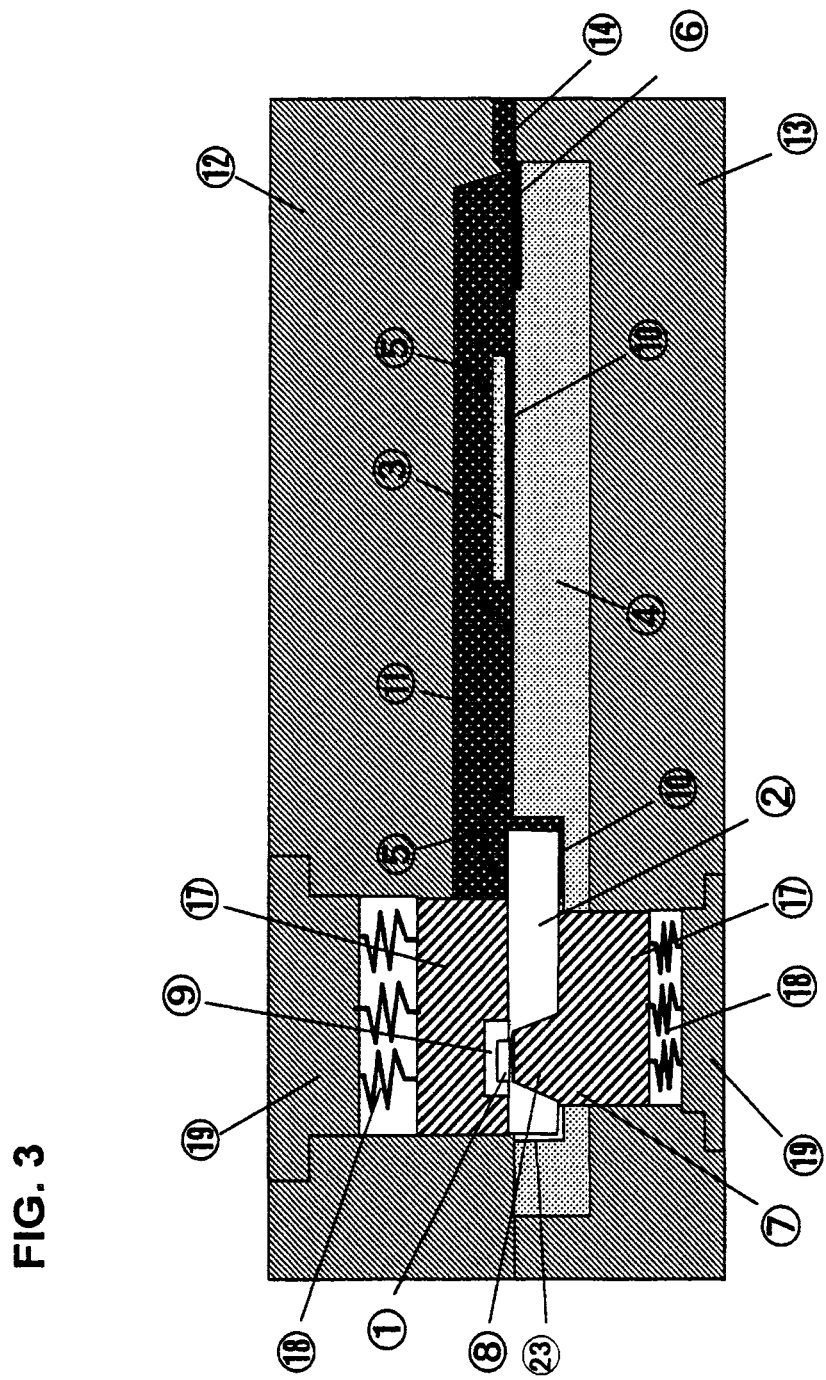
FIG. 3 shows a manufacturing method using a mold having a structure in which at least one of the molds clamping the semiconductor device from above and below is composed of an insert capable of sliding within the mold, and one side of the insert capable of sliding within the mold opposite to the side in contact with the semiconductor device is supported via an elastic member such as springs.
Figure 4:
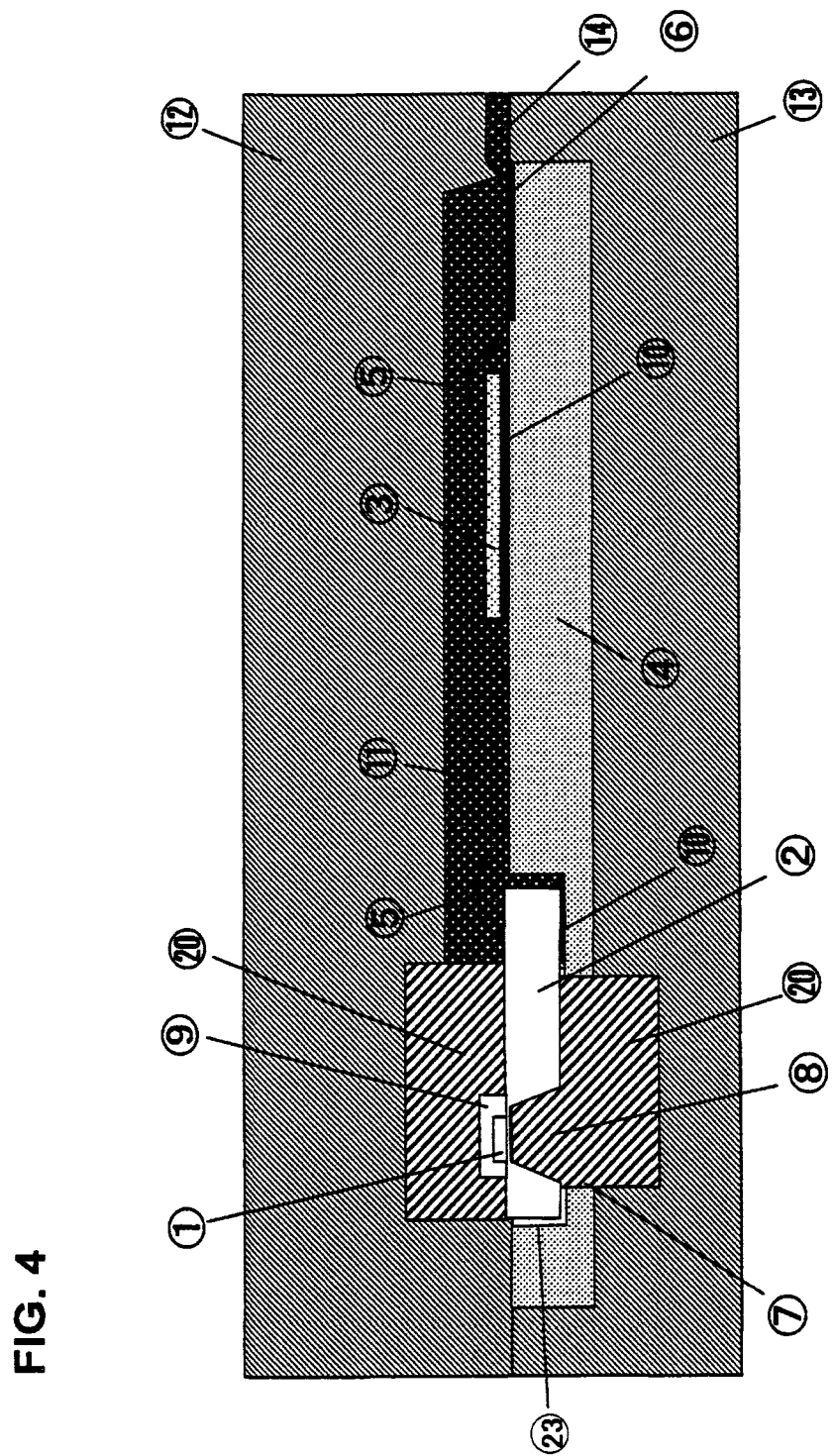
FIG. 4 shows a manufacturing method using a mold having a structure in which an elastic insert formed for example of Teflon (registered trademark) is disposed at least in one of the molds clamping the semiconductor device from above and below.

FIGS. 3, 4 and 5 are A-A cross-sections of FIG. 1, showing a state in which the structure prior to molding of FIG. 1 is placed in the mold and subjected to molding.

Now, as shown in FIG. 3, it is possible to use a mold having a structure where at least one of the molds for clamping the semiconductor device 2 from above and below is composed of a movable insert 17 capable of moving in sliding motion within the mold, wherein the side of the movable insert 17 opposite from the side in contact with the semiconductor device 2 is supported by an elastic member such as a spring 18. Further, the spring 18 is fixed in the mold via a spring presser 19.

Moreover, as shown in FIG. 4, it is also possible to use a mold having a structure in which an elastic insert 20 such as Teflon is placed in at least one of the molds clamping the semiconductor device 2 from above and below.

Polymeric material such as Teflon and fluorine resin can be used as the elastic member.

Further, as shown in FIG. 5, it is possible to use a mold having a lower mold 13 inserted from an opening 7 on the board 4 to support the semiconductor device 2 and having an elastic film 21 disposed on the upper mold 12 in contact with the mold resin material 11, thereby clamping the semiconductor device 2 from above and below via the elastic film 21.

Further, FIG. 5A is a cross-sectional view showing an A-A cross-section of FIG. 1 in which the structure prior to molding of FIG. 1 is placed in a mold and subjected to molding, wherein FIGS. 5B and 5C show the B-B cross-section of FIG. 5A.

Now, it is necessary to stop the flow of resin 11 by blocking the clearance between the semiconductor device 2 and the board 4 in the B-B cross-section so as to prevent resin 11 from flowing into the diaphragm 8 section.

The clearance between the semiconductor device 2 and the board 4 in the B-B cross-section can be blocked to prevent resin 11 from flowing therein by placing an elastic member 15 such as a Teflon block 15 as shown in FIG. 5B or by adopting an insert 16 disposed on the upper mold 12 as shown in FIG. 5C.

Now, it is possible to use a polymeric material such as Teflon or fluorine resin as the elastic film 21, and the variation in dimension of the elastic film 21 in the thickness direction can prevent the occurrence of resin leak or crack during molding even when the dimension of the semiconductor device 2 is varied.

As described, the use of molds having structures shown in FIG. 3, 4 or 5 enables molding to be performed without causing resin 11 leak or semiconductor device 2 crack even when the dimension of the semiconductor device 2 is varied.

Further, it is possible to adopt the movable insert 17 supported via the elastic member shown in FIG. 3 or the elastic insert 20 shown in FIG. 4 in the portion for clamping the semiconductor device 2 shown in FIG. 5.

Figure 6:
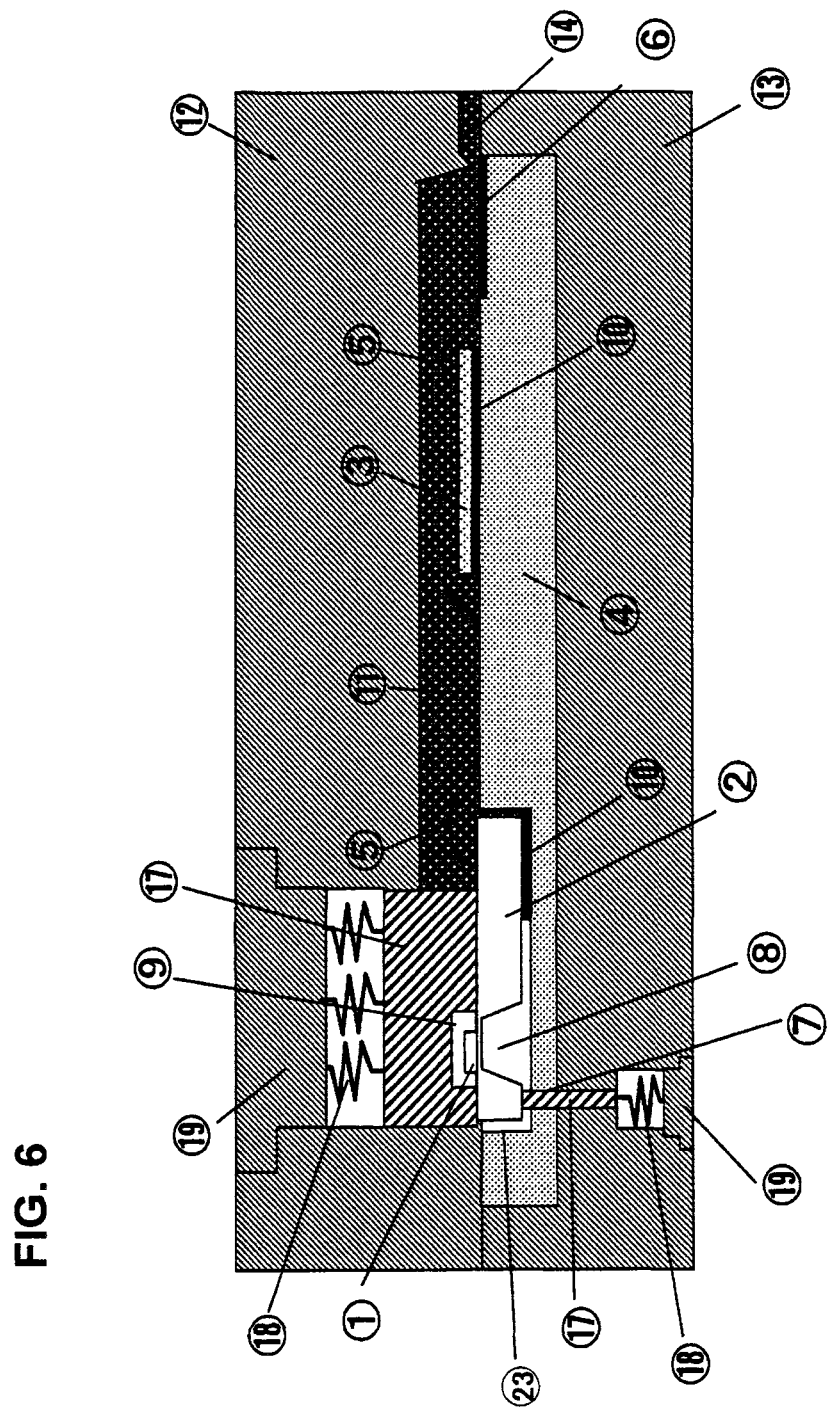
FIG. 6 is a manufacturing method using a mold that does not support the diaphragm of the semiconductor device via an insert.

FIGS. 3, 4 and 5 illustrate a structure in which the diaphragm 8 is supported via an insert from the opening 7 of the board 4, but it is also possible to adopt a structure as illustrated in FIG. 6 in which the diaphragm 8 of the semiconductor device 2 is not supported via an insert.

Moreover, in the mold illustrated in FIG. 3, it is possible to place an insert such as an elastic insert 20 formed for example of Teflon to either the upper mold 12 or the lower mold 13.

In the mold illustrated in FIG. 4, it is possible to place an insert 16 supported via an elastic member such as springs 18 to either the upper mold 12 or the lower mold 13.

[Structure After Molding]

FIG. 7A is a plan view of a flow sensor formed by molding a structure including the semiconductor device 2 and the control board 4 prior to molding illustrated in FIG. 1 in the mold illustrated in FIG. 3.

FIG. 7B is an A-A cross-section of FIG. 7A, wherein the gold wires 5 for electrically connecting the semiconductor device 2 and the board 4 or the electric control circuit 3 and the board 4 are insulated via a mold resin 11, and the detected flow is output via an electric signal output section 38.

Further, the present flow sensor can adopt a structure in which the semiconductor device 2, the resin mold 11 and the board 4 are not in contact with each other except for the area where the semiconductor 2, the gold wires 5 for transmitting the electric signal from the semiconductor device 2 and the board 4 are integrated via the resin mold.

In other words, the present embodiment enables to provide a flow sensor structure in which the walls 23 of the board 4 form a continuous space with three walls 22 of the semiconductor device 2 orthogonal to the side on which the air flow sensing unit portion of the semiconductor device 2 is disposed, thereby surrounding the semiconductor device 2.

[Structure of Lead Frame 24]

FIG. 8A shows a plan view prior to molding of the flow sensor according to the present invention. FIG. 8B shows a plan view of a rear side of FIG. 8A, and FIG. 8C shows an A-A cross-section of FIG. 8A.

As shown in FIG. 8A, FIG. 8B and FIG. 8C, the flow sensor prior to molding comprises a semiconductor device 2 having an air flow sensing unit 1 and a diaphragm 8 formed thereto, and a lead frame 24 having an opening 25 formed on one side and an electric control circuit 3 for controlling the semiconductor device 2 formed on the other side, wherein the semiconductor device 2 is mounted on the projected area of the opening 25. The electric control circuit 3 and the semiconductor device 2 are attached via an adhesive 10 or the like to the lead frame 24. Furthermore, a dam 28 of the lead frame portion is clamped in the mold to prevent resin from flowing out of the mold, and the dam 28 is cut away after molding so that electric signals are output from the output terminals 27.

[Manufacturing Method]

Now, a manufacturing method for sealing the structure including the semiconductor device 2 and the electric control board 4 disposed on the lead frame 24 of FIG. 8 in a mold using resin will be illustrated in FIG. 9.

Figure 9A:
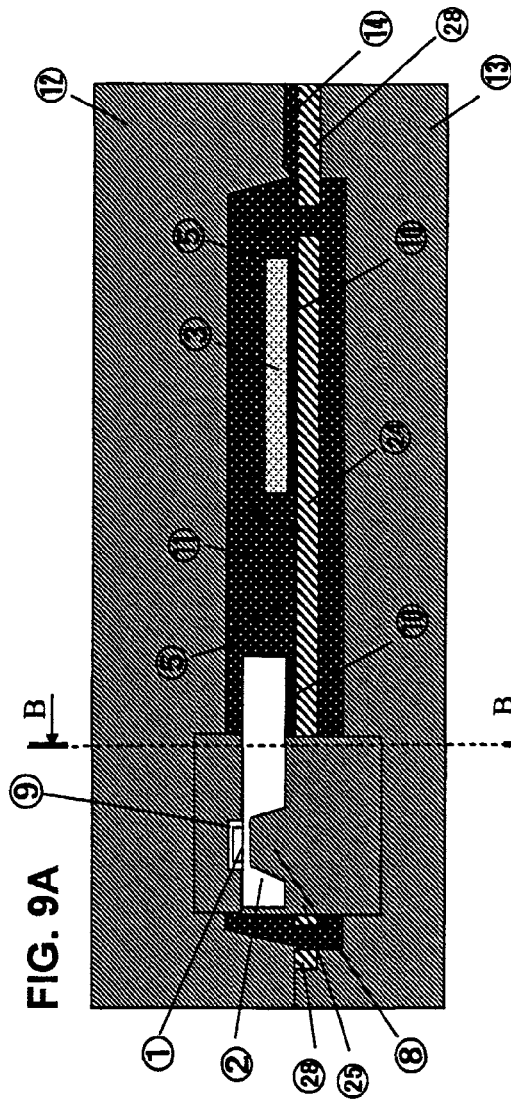
FIG. 9A is a cross-sectional view showing the structure prior to molding of the A-A cross-section of FIG. 8C placed in a mold and subjected to molding.

FIG. 9A is an A-A cross-section of FIG. 8, showing a cross-sectional view in which the structure prior to molding of FIG. 8 is placed in the mold and subjected to molding.

A lower mold 13 is inserted to an opening 25 formed on the lead frame 24 so as to clamp and fix the semiconductor device 2 from above and below via molds, and while having a part of the semiconductor device 2 exposed, a resin layer 11 is formed on a surface including a part of the semiconductor device 2.

As described, the dimensional accuracy of the semiconductor device 2 during molding can be improved by clamping the semiconductor device 2 from above and below via the mold. Here, the dam 28 of the lead frame portion is clamped via the mold to prevent resin 11 from flowing out of the mold.

Furthermore, resin 11 is filled in the mold through a gate 14 while having a space 9 formed within the mold so that the flow sensor 1 will not contact the mold, according to which the electric control circuit 3, the gold wires 5, and a part of the semiconductor device 2 can be sealed via the resin 11.

Figure 9C:
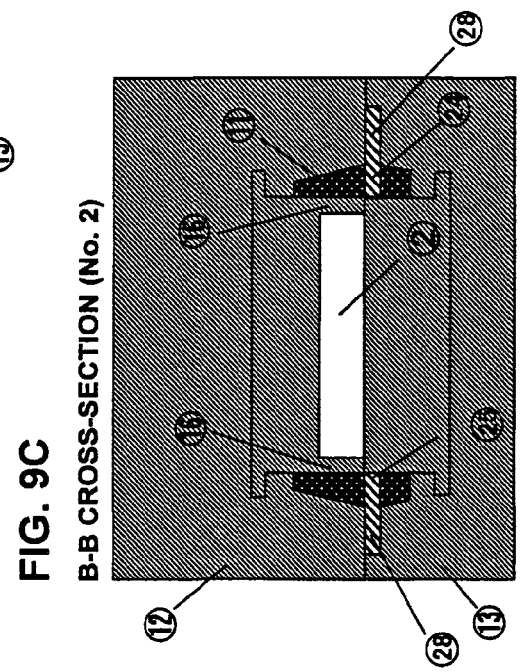
FIG. 9C is a B-B cross-section of FIG. 9A.
Figure 9B:
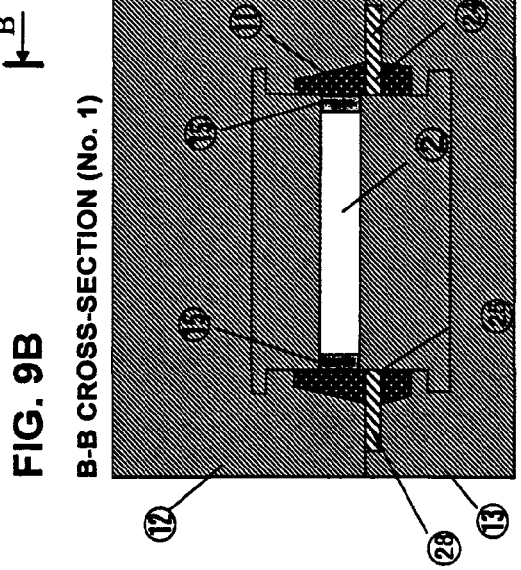
FIG. 9B is a B-B cross-section of FIG. 9A.

The B-B cross-section of FIG. 9A is formed as shown in FIG. 9B or FIG. 9C. Now, it is necessary to block the flow of resin 11 by blocking the clearance between the semiconductor device 2 and the board 4 in the B-B cross-section so as to prevent the resin 11 from flowing into the diaphragm 8 portion.

The clearance between the semiconductor device 2 and the board 4 in the B-B cross-section is blocked by disposing an elastic member 15 such as a Teflon block as shown in FIG. 9B or by disposing an insert 16 attached to the lower mold 13 as shown in FIG. 9C to block the flow of resin 11.

Now, since the semiconductor device 2 has varied dimensions, when carrying out the manufacturing method of FIG. 9, resin 11 will leak on the semiconductor device 2 if the dimension of the semiconductor device 2 is smaller than the mold clamp dimension, and the semiconductor device 2 may crack if the size of the semiconductor device 2 is greater than the mold clamp dimension.

Figure 10:
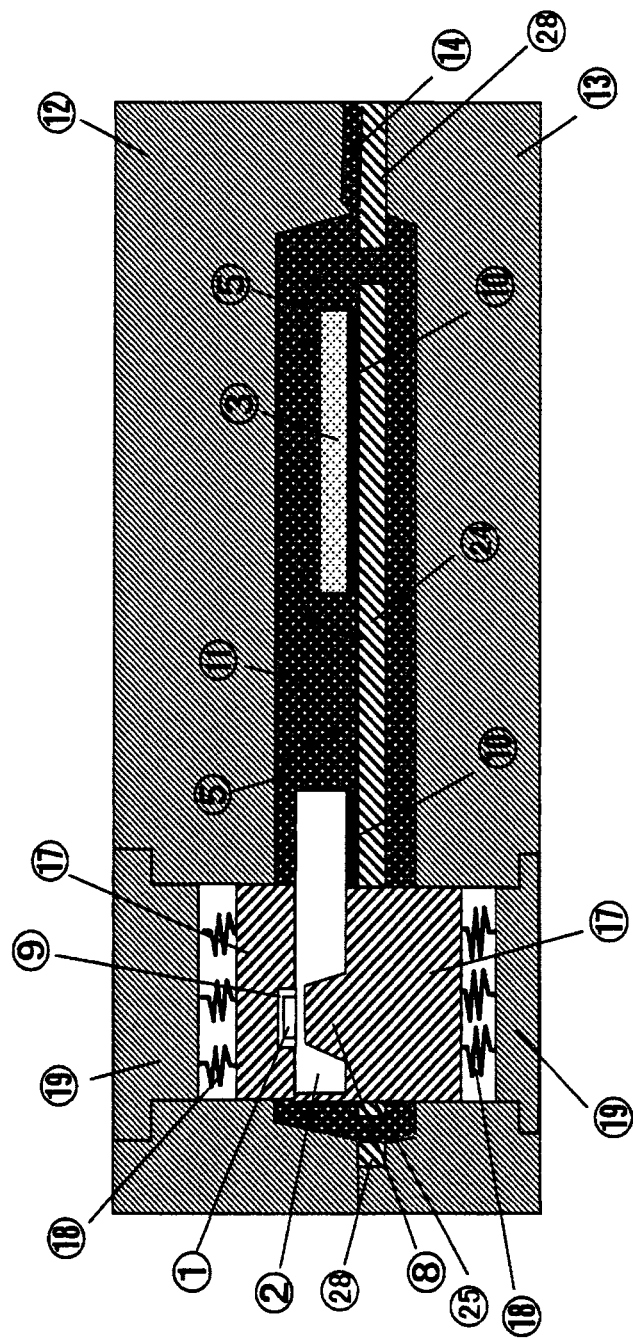
FIG. 10 shows a manufacturing method using a mold having a structure in which at least one of the molds clamping the semiconductor device from above and below is composed of an insert capable of sliding within the mold, wherein the side of the movable insert opposite from the side in contact with the semiconductor device is supported via an elastic member such as springs.
Figure 11:
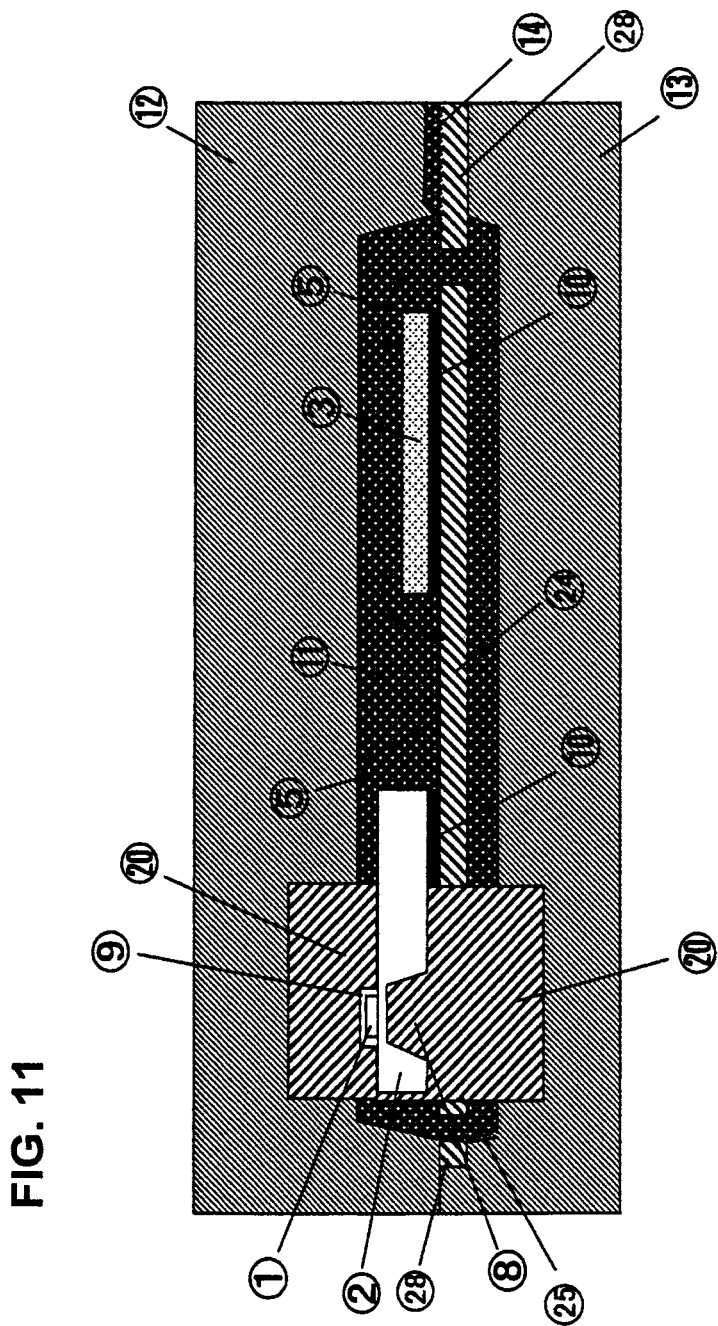
FIG. 11 shows a manufacturing method using a mold having a structure in which at least one of the molds clamping the semiconductor device from above and below has an elastic insert formed for example of Teflon disposed therein.
Figure 12:
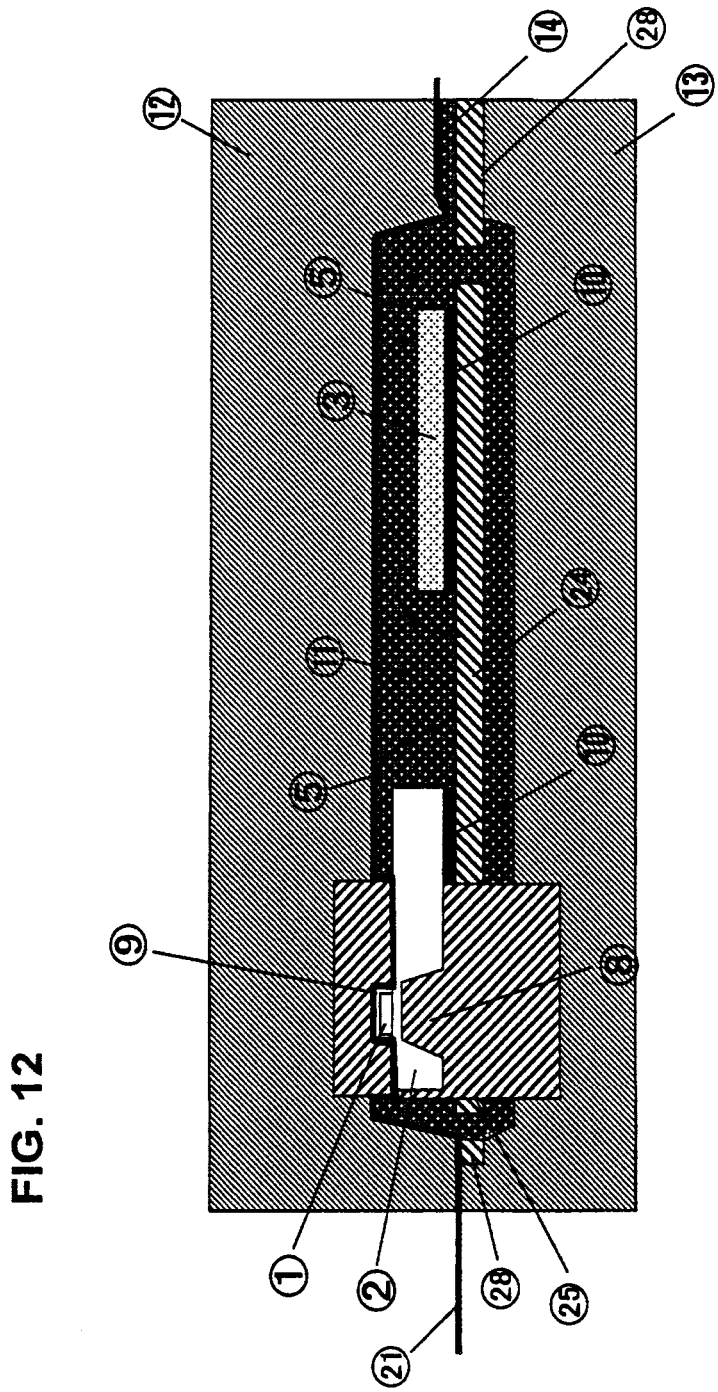
FIG. 12 shows a manufacturing method using a mold supporting the semiconductor device via an insert of the mold from the opening of the board, and clamping the semiconductor device from above and below via an elastic film disposed on the upper mold side of the mold in contact with the resin material.

FIGS. 10, 11 and 12 show an A-A cross-section of FIG. 8, which are cross-sectional views showing the structure prior to molding of FIG. 8 placed in the mold and subjected to molding.

As shown in FIG. 10, the mold can adopt a structure in which at least one of the molds for clamping the semiconductor device 2 from above and below is composed of a movable insert 17 capable of moving in sliding motion within the mold, and the side of the movable insert 17 opposite from the side in contact with the semiconductor device 2 is supported via an elastic member such as springs 18. The springs 18 are fixed within the mold via a spring presser 19.

Further, as shown in FIG. 11, the mold can adopt a structure in which an elastic insert 20 formed for example of Teflon is placed in at least one of the molds for clamping the semiconductor device 2 from above and below.

Now, the elastic insert 20 can be formed of a polymeric material such as Teflon and fluorine resin.

Even further, as shown in FIG. 12, the mold can adopt a structure in which a lower mold 13 is inserted from the opening of the lead frame 24 to support the semiconductor device 2 and an elastic film 21 is disposed on the surface of an upper mold 12, to thereby clamp the semiconductor device 2 from above and below via the elastic film 21.

Now, the elastic film 21 can be formed of a polymeric material such as Teflon and fluorine resin, and since the dimension of the elastic film 21 can be varied in the thickness direction, molding can be performed without causing leak of resin 11 or crack of semiconductor device 2 even if the dimension of the semiconductor device 2 is varied, and the change in the dimension in the thickness direction of the elastic film 21 can prevent the resin 11 from leaking or the semiconductor device 2 from cracking during molding even when the dimension of the semiconductor device 2 is varied.

As described, by using a mold having the structure illustrated in FIG. 10, FIG. 11 or FIG. 12, molding can be performed without causing leak of resin 11 or crack of semiconductor device 2 even when the dimension of the semiconductor device 2 is varied.

It is also possible to adopt a structure in which the movable mold 17 supported via the elastic member shown in FIG. 10 or the elastic insert 20 shown in FIG. 11 is placed in the section for clamping the semiconductor device 2 shown in FIG. 12.

Figure 13:
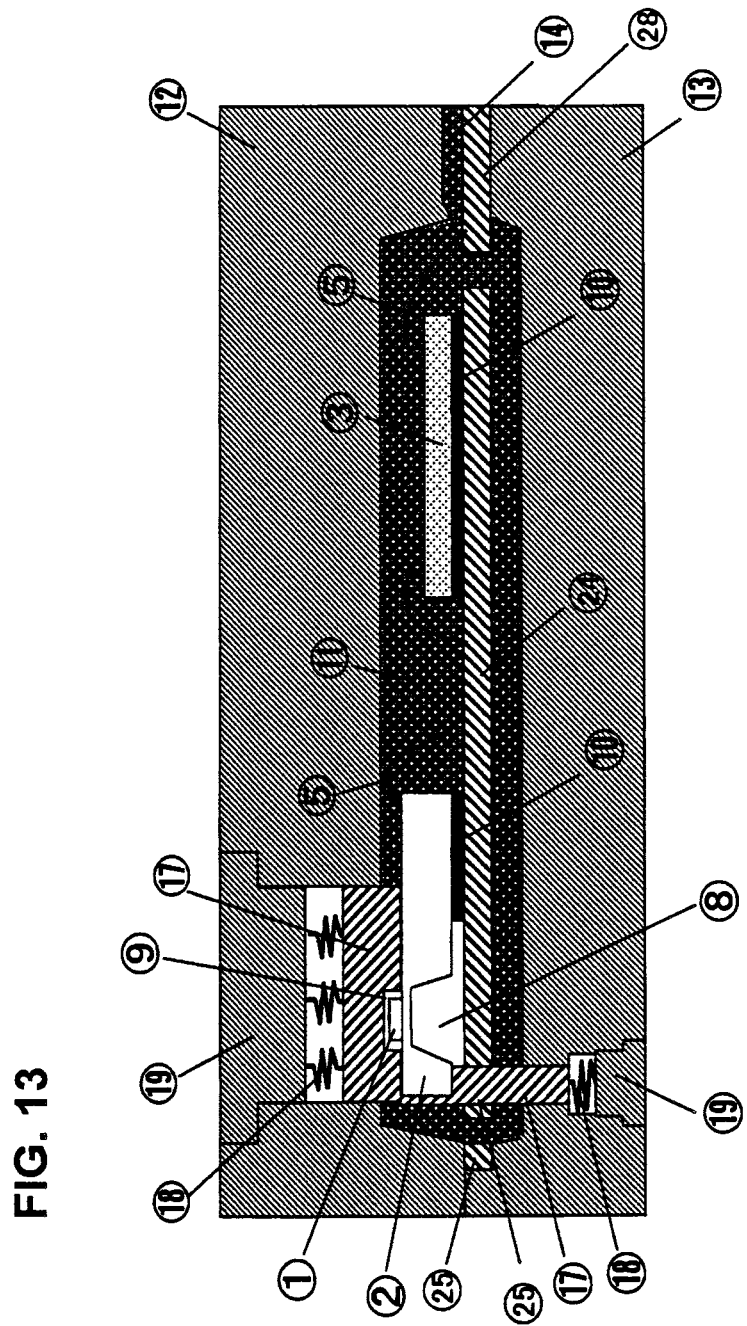
FIG. 13 shows a manufacturing method using a mold structure that does not support the diaphragm portion of the semiconductor device via an insert.

FIGS. 10, 11 and 12 adopt a structure in which the diaphragm 8 is supported via an insert from the opening of the board 4, but it is also possible to adopt a structure as shown in FIG. 13 in which the diaphragm 8 of the semiconductor device 2 is not supported via the movable insert 17.

Furthermore, the mold shown in FIG. 10 can have an insert such as an elastic insert 20 formed of Teflon disposed on either the upper mold 12 or the lower mold 13.

The mold shown in FIG. 11 can have a movable insert 17 supported via an elastic member such as springs 18 disposed on either the upper mold 12 or the lower mold 13.

[Structure After Molding]

FIG. 14A shows a plan view in which the structure including the semiconductor device 2 and the control board 4 prior to molding shown in FIG. 8 is molded via the mold shown in FIG. 10.

FIG. 14B is an A-A cross-section of FIG. 14A. As shown, the gold wires 5 electrically connecting the semiconductor device 2 and the lead frame 24 or the electric control circuit 3 and the lead frame 24 are insulated via the mold resin 11.

Figure 15:
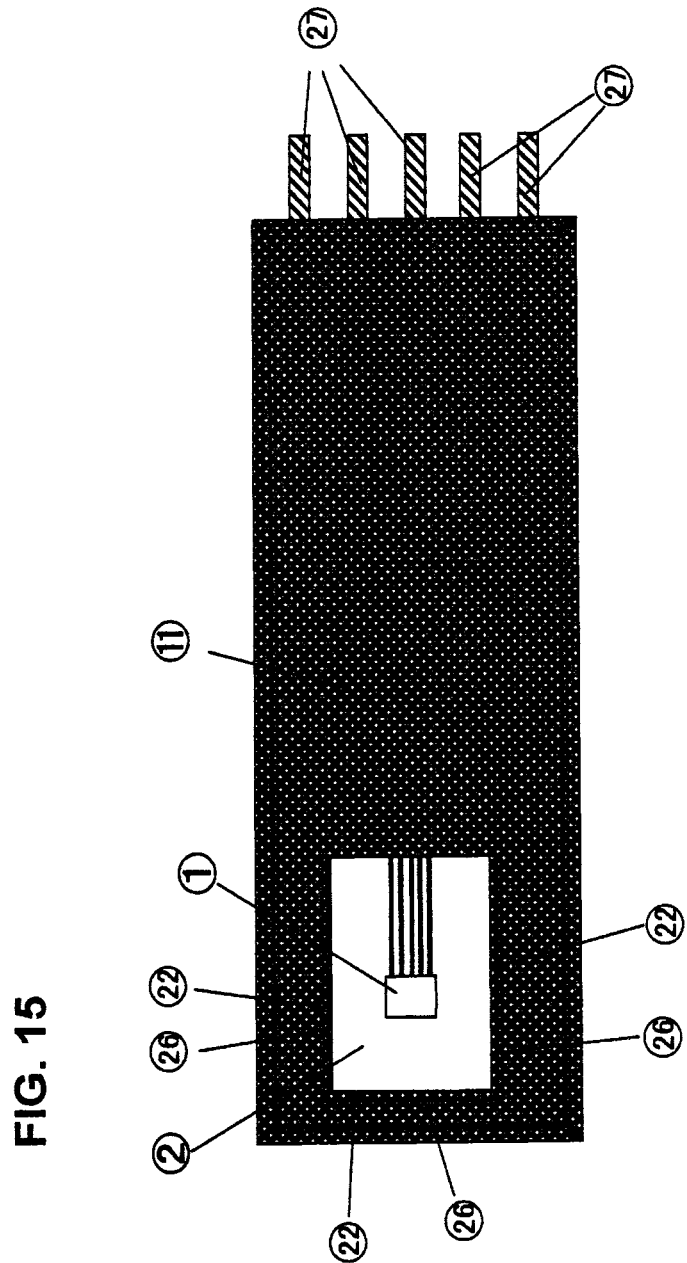
FIG. 15 shows a structure in which the dam portion of the lead frame other than the output terminals of the molded structure of FIG. 14 is cut away.

Further, FIG. 15 illustrates a structure in which the dam 28 of the lead frame 24 excluding the output terminals 27 is cut away, so that the detected flow is output as electric signals through the output terminals 27.

Further, it is possible to adopt a structure in which the semiconductor device 2 and the resin 11 mold are not in contact with each other except for the area where the semiconductor 2, the gold wires 5 for transmitting the electric signals of the semiconductor 2 and the lead frame 24 are integrally molded via resin 11.

In other words, it is possible to provide a structure of a flow sensor in which resin walls 26 formed of the molded portion of resin 11 define a continuous space with three sides 22 orthogonal to the surface on which the air flow sensing unit is disposed on the semiconductor device 2, thereby surrounding the semiconductor device 2.

[Structure for Exposing Semiconductor Device from End of Board 4]

FIG. 16A is a plan view showing the surface of the flow sensor according to the present invention prior to molding. FIG. 16B is an A-A cross-section of FIG. 16A.

As shown in FIGS. 16A and 16B, the flow sensor prior to molding adopts a structure in which a semiconductor device 2 having an air flow sensing unit 1 and a diaphragm 8 formed thereto is exposed from the end of a board 4, and on the other end of the board 4 is disposed an electric control circuit 3 for controlling the semiconductor device 2.

[Manufacturing Method]

Figure 17:
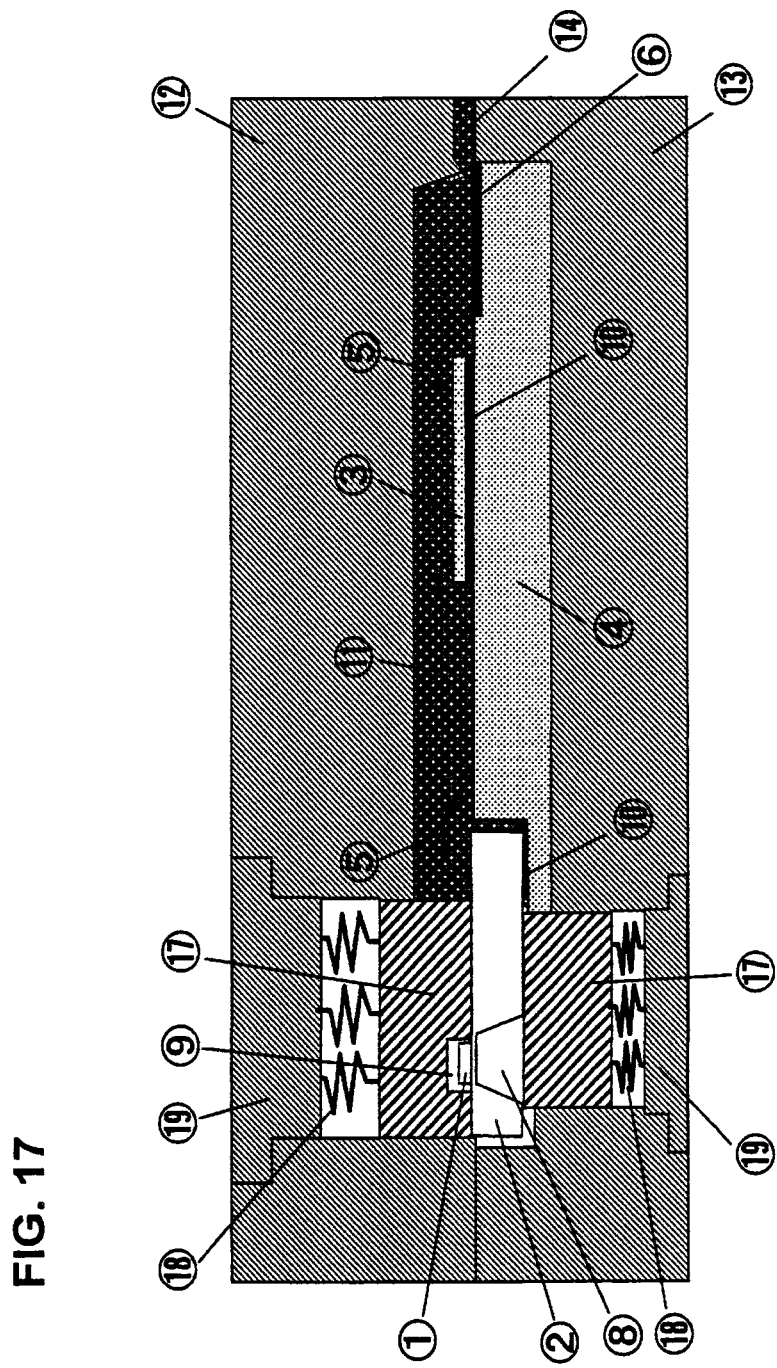
FIG. 17 shows a manufacturing method in which the structure prior to molding shown in FIG. 16 is disposed in a mold and subjected to molding.

Now, a manufacturing method for sealing the structure including the semiconductor device 2 disposed on the board 4 and the control board 4 illustrated in FIG. 16 via a mold using resin 11 will be shown in FIG. 17.

FIG. 17 is an A-A cross-section of FIG. 16, which is a cross-sectional view showing the state where the structure prior to molding of FIG. 16 is placed in a mold and subjected to molding.

The semiconductor device 2 is clamped and fixed from above and below via a mold, and a resin 11 layer is formed on the surface including a part of the semiconductor device 2 while exposing a part of the semiconductor device 2. As shown, the mold can adopt a structure in which at least one of the molds clamping the semiconductor device 2 from above and below is composed of a movable insert 17 capable of moving in sliding motion within the mold, and the side of the movable insert 17 opposite to the side in contact with the semiconductor device 2 is supported via an elastic member such as springs 18.

Further, the mold shown in FIG. 17 can adopt a mold structure in which an elastic insert 20 formed for example of Teflon can be disposed on at least one of the molds clamping the semiconductor device 2 from above and below, as shown in FIG. 4.

Furthermore, the mold shown in FIG. 17 can adopt a mold structure in which an elastic film 21 is placed on the side of the upper mold 12 in contact with the resin 11 material of the mold and clamping the semiconductor device 2 from above and below via the elastic film 21, as shown in FIG. 5.

By adopting the movable insert 17 supported via elastic members as shown in FIG. 17, it becomes possible to mold the semiconductor device 2 without causing leak of resin 11 or crack even when the dimension of the semiconductor device 2 is varied.

[Post-Mold Structure]

Figure 18A:
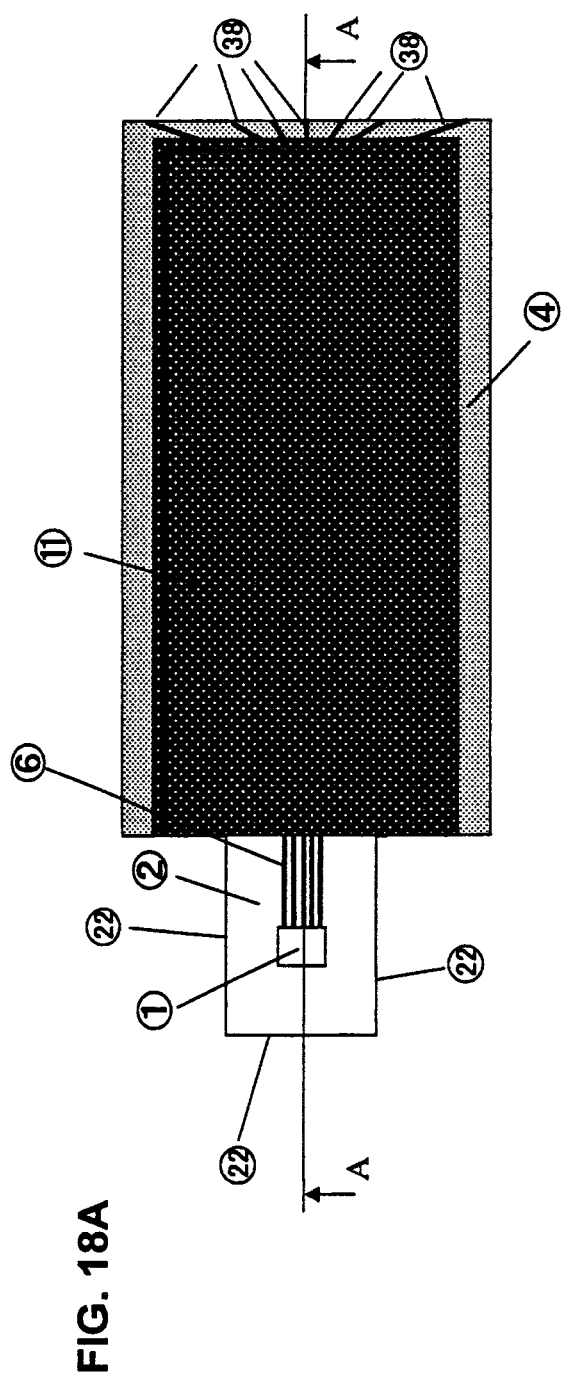
FIG. 18A is a plan view of a structure in which the structure including the semiconductor device and the control board prior to molding shown in FIG. 16 is subjected to molding in the mold shown in FIG. 17.

FIG. 18A is a plan view of a structure in which the structure including the semiconductor device 2 and the control board 4 prior to molding shown in FIG. 16 is molded in the mold shown in FIG. 17.

Figure 18B:
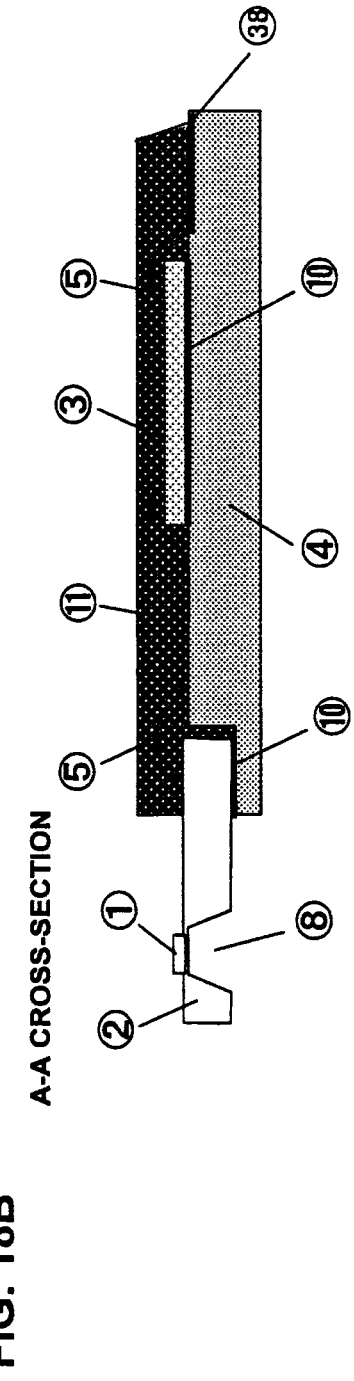
FIG. 18B is an A-A cross-section of FIG. 18A.

FIG. 18B is an A-A cross-section of FIG. 18A. As illustrated, gold wires 5 for electrically connecting the semiconductor device 2 and the board 4 or the electric control circuit 3 and the board 4 are insulated via a mold resin 11, and the detected flow is output via an electric signal output section 38.

Further, when using the flow sensor illustrated in FIG. 18, a structure having a continuous space with the semiconductor device 2 should be disposed to surround the semiconductor device 2 to thereby prevent air from flowing into the diaphragm 8 section.

Figures 19A, 19B:
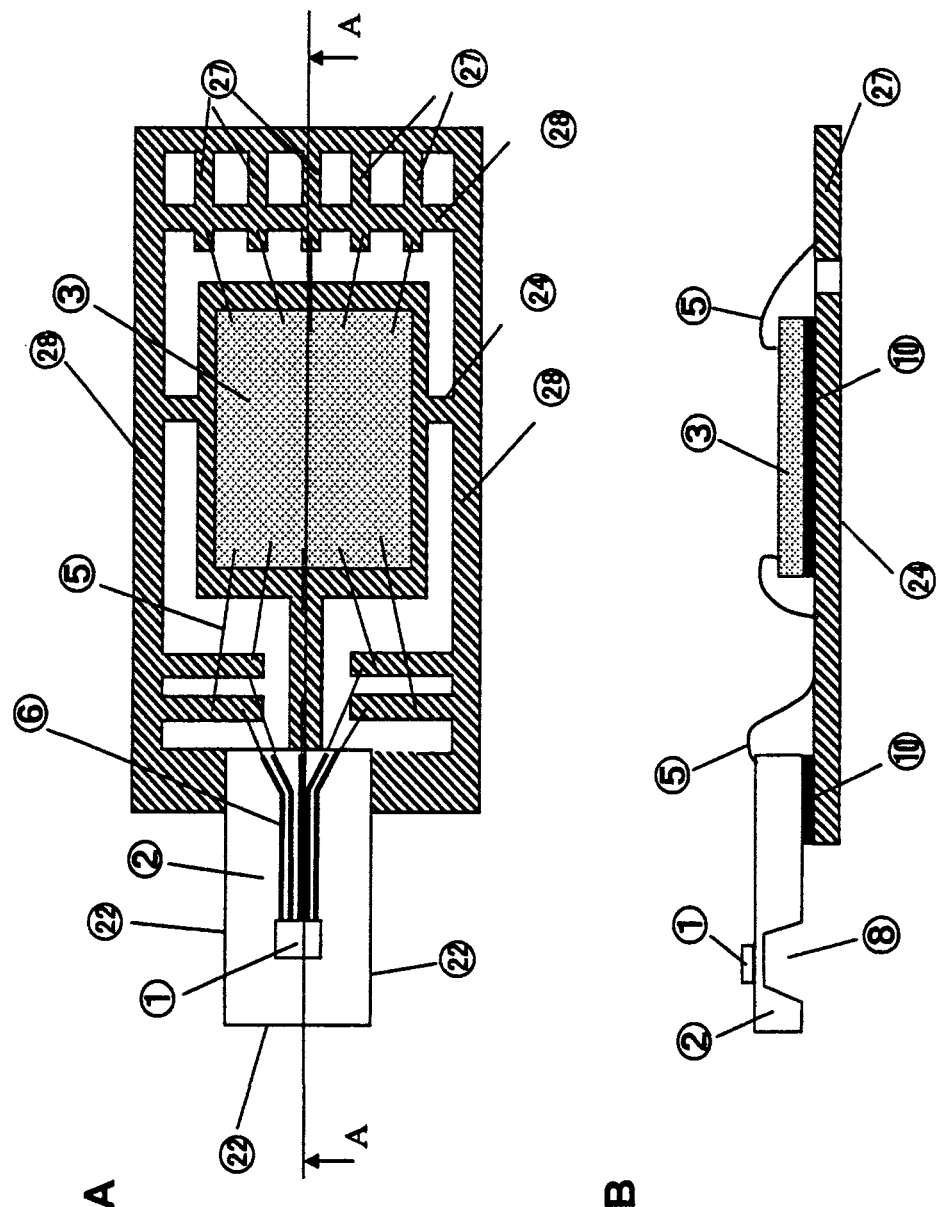
FIG. 19A is a plan view of a surface of a flow sensor prior to molding, showing a flow sensor structure prior to molding having a semiconductor device including an air flow sensing unit and a diaphragm exposed from an end portion of a lead frame.
FIG. 19B is an A-A cross-section of FIG. 19A.

FIG. 19A is a plan view of a surface of the flow sensor according to the present invention prior to molding. FIG. 19B is an A-A cross-section of FIG. 19A.

As shown in FIGS. 19A and 19B, the flow sensor prior to molding adopts a structure in which a semiconductor device 2 including an air flow sensing unit 1 and a diaphragm 8 is exposed from the end of a lead frame 24, and on the other side of the lead frame 24 is disposed an electric control circuit 3 for controlling the semiconductor device 2.

[Manufacturing Method]

Figure 20:
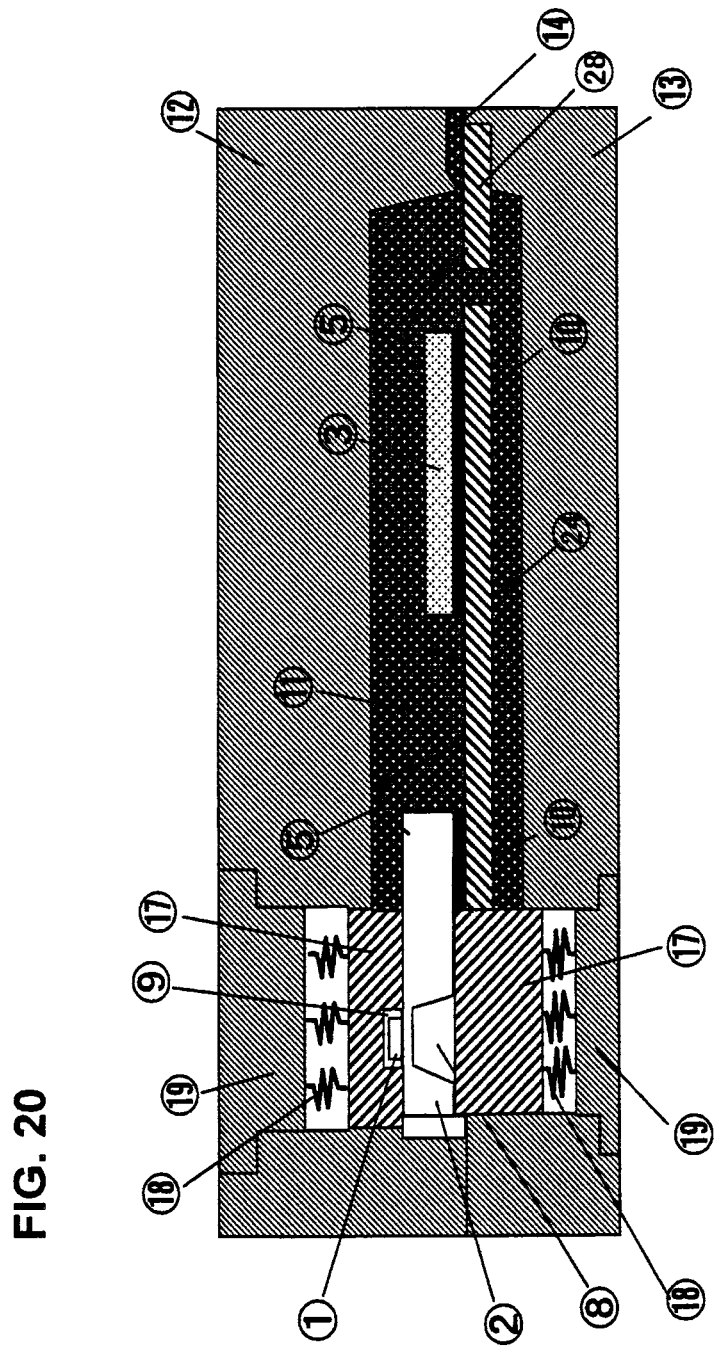
FIG. 20 is a manufacturing method in which the structure prior to molding shown in FIG. 19 is placed in a mold and subjected to molding.

Now, FIG. 20 illustrates a manufacturing method for sealing via resin the structure including the air flow sensing unit 1 and the control board 4 disposed on the lead frame 24 using a mold.

FIG. 20 is a cross-sectional view showing the A-A cross-section of FIG. 19 in which the structure prior to molding of FIG. 19 is placed in a mold and subjected to molding.

The semiconductor device 2 is clamped from above and below via a mold, and a resin 11 layer is formed on a surface including a part of the semiconductor device 2 while having a part of the semiconductor device 2 exposed. As shown, the mold can adopt a structure in which at least one of the molds for clamping the semiconductor device 2 from above and below is formed of a movable insert 17 capable of moving in sliding motion within the mold, and the side of the movable mold opposite from the side in contact with the semiconductor device 2 is supported via an elastic member such as springs 18.

Moreover, the dam 28 of the lead frame portion is clamped via the mold so as to prevent resin 11 from flowing out of the mold.

Furthermore, the mold shown in FIG. 20 can adopt a structure in which an elastic insert 20 formed for example of Teflon can be disposed on at least one of the molds for clamping the semiconductor device 2 from above and below, as shown in FIG. 4.

Further, the mold shown in FIG. 20 can adopt a mold structure in which an elastic film 21 is placed on the side of the upper mold 12 in contact with the resin 11 material of the mold and clamping the semiconductor device 2 from above and below via the elastic film 21, as shown in FIG. 5.

By adopting the movable insert supported via elastic members as shown in FIG. 20, the semiconductor device 2 can be molded without causing leak of resin 11 or crack of semiconductor device even when the dimension of the semiconductor device 2 is varied.

[Post-Molding Structure]

FIG. 21A is a plan view of a structure in which the structure including the semiconductor device 2 and the control board 4 prior to molding shown in FIG. 19 is molded in the mold shown in FIG. 20.

FIG. 21B is an A-A cross-section of FIG. 21A. As illustrated, gold wires 5 for electrically connecting the semiconductor device 2 and the lead frame 24 or the electric control circuit 3 and the board 4 are insulated via a mold resin 11, and after the dam 28 portion of the lead frame is cut away, the detected flow is output via electric signal output terminals 27.

Further, when using the flow sensor illustrated in FIG. 20, a structure having a continuous space with the semiconductor device 2 should be disposed to surround the semiconductor device 2 to thereby prevent air from flowing into the diaphragm 8 section.

[Placing the Flow Sensor in Air Passage]

FIG. 22A is a plan view of an example where the flow sensor of FIG. 7 sealed via resin is disposed on a structure 29 having a passage for air formed therein, wherein the structure 29 including the air passage has an air passage groove 30 formed thereto.

FIG. 22B is an A-A cross-section of FIG. 22A. As shown, by inserting and fixing a positioning projection 33 of the structure 29 having the air passage to the opening 7 of the flow sensor, the positioning accuracy of the structure 29 having the air passage and the flow sensor can be improved and the assembly time thereof can be shortened.

FIG. 22C is a cross-sectional view of an example where a cover 34 is disposed on the structure 29 having the air passage equipped with the flow sensor shown in the cross-section of FIG. 22B.

The air passage 30 shown in FIG. 22C is designed so that the air taken in through an inlet 31 shown in FIG. 22A flows through the air passage 30, passes the upper portion of the flow sensor, and exits through an outlet 32 formed on an upper portion shown in FIG. 22A.

[Structure having Different Thickness in Stepped Portion of Board 4]

FIG. 23A shows a plan view of a surface of the flow sensor prior to molding. FIG. 23B shows a first embodiment of the A-A cross-section of FIG. 23A.

As shown in FIGS. 23A and 23B, the flow sensor prior to molding comprises a semiconductor device 2 having an air flow sensing unit 1 and a diaphragm 8 formed thereto, and a board 4 having an electric control circuit 3 disposed for controlling the semiconductor device 2, wherein the semiconductor device 2 is mounted on a stepped portion and electric signals are transmitted through gold wires 5 and wirings 6 disposed on the board 4. Further, the electric control circuit 3 is attached to the board 4 via an adhesive 10 or the like.

The present structure has a varied thickness in the stepped portion of the board 4 on which the semiconductor device 2 is disposed, wherein the side of the semiconductor device 2 close to the electric control circuit 3 is attached to the board 4 via an adhesive 10 or the like, and the side of the semiconductor device 2 opposite from the electric control circuit 3 is in contact with a portion 35 where the stepped portion has greater thickness.

FIG. 23C illustrates a second embodiment of the A-A cross-section of FIG. 23A. As illustrated, the side of the semiconductor device 2 close to the electric control circuit 3 is attached to the board 4 via an adhesive 10 or the like, and the side of the semiconductor device 2 opposite from the electric control circuit 3 is supported via the stepped portion of the board 4 and a spacer 36.

The spacer 36 can be formed of organic materials such as Teflon, fluorine resin, epoxy resin or polycarbonate resin, and the semiconductor device 2 can either be bonded to or not bonded to the board 4.

[Manufacturing Method]

Now, a manufacturing method for sealing via resin the structure including the semiconductor device 2 disposed on the board 4 and the control board 4 via a mold is shown in FIG. 24.

FIG. 24A illustrates an example where the structure prior to molding shown in the A-A cross-section of FIG. 23B is placed in a mold and subjected to molding.

A mold is used in which an elastic film 21 is disposed on a surface of an upper mold 12 and the semiconductor device 2 is clamped from above and below via the elastic film 21.

In the example, as shown in FIG. 23B, the portion of the semiconductor device 2 facing the diaphragm 8 and opposite from the electric control circuit 3 is in contact with a portion where the thickness of the stepped portion is greater, so that even when the semiconductor device 2 is clamped by the upper mold 12 via the elastic film 21, the device can be accurately positioned in the mold in the clamping direction.

FIG. 24B or FIG. 24C illustrate the B-B cross-section of FIG. 24A.

The flow of resin 11 must be blocked by closing the clearance between the semiconductor device 2 and the board 4 in the B-B cross-section, so that resin 11 will not flow into the diaphragm 8 section.

The clearance between the semiconductor device 2 and the board 4 in the B-B cross-section can be blocked by disposing an elastic member 15 such as a Teflon block as shown in FIG. 24B or by an insert 16 disposed on the upper mold 12 as shown in FIG. 24C.

Polymeric materials such as Teflon and fluorine resin can be used for the elastic film 21, and the variation of dimension in the thickness direction of the elastic film 21 enables the semiconductor device to be molded without causing leak of resin 11 or crack of semiconductor device even when the dimension of the semiconductor device 2 is varied.

According to the present flow sensor formed after molding, the semiconductor device 2 is not in contact with the resin 11 mold except for the area where the semiconductor device 2, the gold wires 5 for transmitting electric signals from the semiconductor device 2 and the board 4 are integrally molded via resin 11.

In other words, the present invention enables to provide a flow sensor structure in which the walls 23 of the board 4 form a continuous space with three sides 22 of the semiconductor device 2 orthogonal to the mounting surface of the air flow sensing unit section of the semiconductor device 2, thereby surrounding the semiconductor device 2.

[Structure Adopting Spacer in Lead Frame Structure]

FIG. 25A shows a plan view of a surface of the flow sensor prior to molding. FIG. 25B is an A-A cross-section of FIG. 25A.

As shown in FIG. 25A and FIG. 25B, the flow sensor prior to molding comprises a semiconductor device 2 having an air flow sensing unit 1 and a diaphragm 8 formed thereto, and a lead frame 24 including an electric control circuit 3 for controlling the semiconductor device 2, wherein electric signals from the semiconductor device 2 are transmitted via the lead frame 24 having a conductive property. Further, the electric control circuit 3 is attached to the board 4 via an adhesive 10 or the like.

As shown in FIG. 25B, the side of the semiconductor device 2 close to the electric control circuit 3 is attached to the lead frame 24 for example via an adhesive 10, and the side of the semiconductor device 2 opposite from the electric control circuit 3 is in contact with and supported via a spacer 36 and the lead frame 24.

The spacer 36 can be formed of organic materials such as Teflon, fluorine resin, epoxy resin or polycarbonate resin, and the semiconductor device 2 can either be bonded to or not bonded to the lead frame 24.

[Manufacturing Method]

Figure 26:
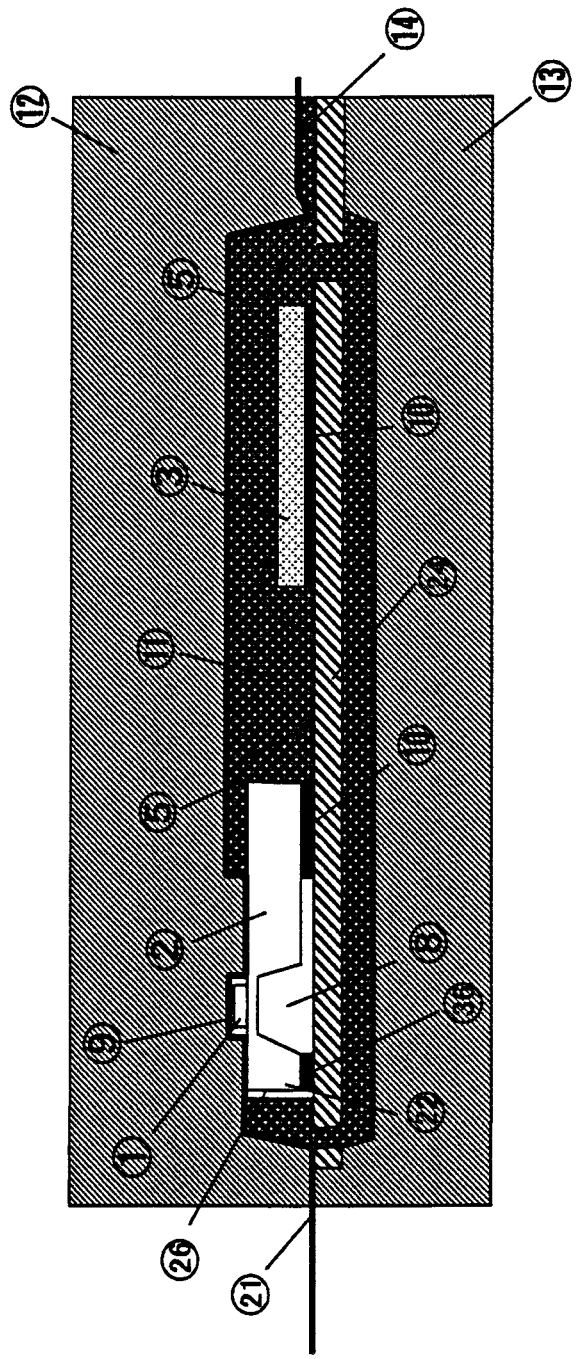
FIG. 26 is a manufacturing method for sealing the structure including the semiconductor device and the control board disposed on the board of FIG. 25 in a mold using resin.

FIG. 26 shows a manufacturing method for sealing via resin the structure including the semiconductor device 2 and the electric control circuit 3 disposed on the board 4 shown in FIG. 25 in a mold.

FIG. 26 illustrates an example where the structure prior to molding shown in the A-A cross-section of FIG. 25B is placed in a mold and subjected to molding.

A mold is used in which an elastic film 21 is disposed on a surface of an upper mold 12 and the semiconductor device 2 is clamped from above and below via the elastic film 21.

In the example, as shown in FIG. 25B, the side of the semiconductor device 2 opposite from the electric control circuit 3 is in contact with a lead frame 24 via a spacer 36, so that even when the semiconductor device 2 is clamped by the upper mold 12 via the elastic film 21, the device can be accurately positioned in the mold in the clamping direction.

The dam 28 of the lead frame is clamped via the mold so as to prevent resin from flowing out of the mold.

Polymeric materials such as Teflon and fluorine resin 11 can be used for forming the elastic film 21, and the variation of dimension in the thickness direction of the elastic film 21 enables the semiconductor device to be molded without causing leak of resin 11 or crack of semiconductor device 2 even when the dimension of the semiconductor device 2 is varied.

When molding is completed, as shown in FIGS. 14 and 15, the dam 28 of the lead frame 24 excluding output terminals 27 is cut away to form the flow sensor, and the detected flow is output as electric signals via the output terminals 27.

According to the present flow sensor, the semiconductor device 2 is not in contact with the resin 11 mold except for the area where the semiconductor device 2, the gold wires 5 for transmitting electric signals from the semiconductor device 2 and the board 4 are integrally molded via resin 11.

In other words, the present invention enables to provide a flow sensor structure in which the wall 26 formed by the resin 11 mold forms a continuous space with three sides 22 of the semiconductor device 2 orthogonal to the mounting surface of the air flow sensing unit section of the device 2, thereby surrounding the semiconductor device 2.

[Pre-Mold and Lead Frame Structure]

Figure 27A:
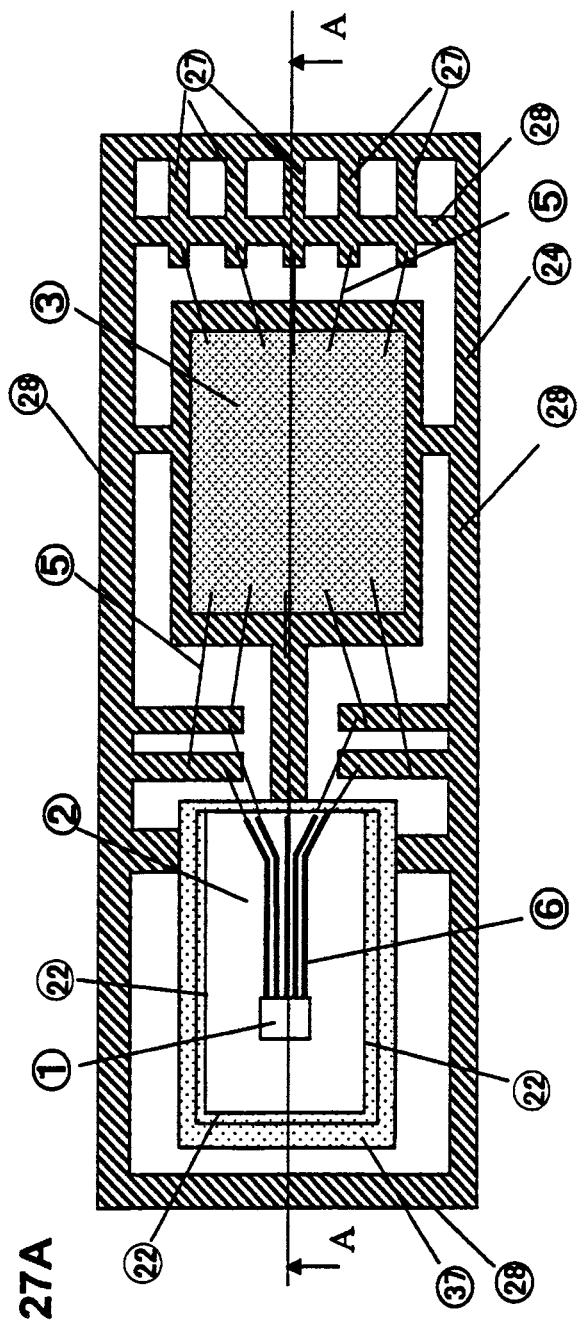
FIG. 27A is a plan view showing a surface of a flow sensor prior to molding comprising a lead frame having a semiconductor device including an air flow sensing unit mounted on a pre-mold component and a diaphragm formed thereto and an electric control circuit 3 for controlling the semiconductor device disposed thereon.

FIG. 27A is a plan view of the surface of a flow sensor prior to molding. FIG. 27B shows an A-A cross-section of FIG. 27A.

As shown in FIGS. 27A and 27B, the flow sensor prior to molding comprises a semiconductor device 2 having an air flow sensing unit 1 and a diaphragm 8 mounted on a pre-mold component 37, and a lead frame having an electric control circuit 3 for controlling the semiconductor device 2 disposed thereon, wherein electric signals from the semiconductor device 2 are transmitted via the lead frame 24 having conductive property. Further, the pre-mold component 37 and the electric control circuit 3 are attached to the board 4 via an adhesive 10 or the like.

Now, FIG. 28A shows a plan view of the pre-mold component 37 formed of resin, and FIG. 28B is an A-A cross-section of FIG. 28A. The pre-mold component 37 comprises a mounting surface 41 of the semiconductor device 2 and sides 42 orthogonal to the mounting surface 41 of the semiconductor device 2, wherein projections 39 are formed at parts of the mounting surface 41 of the semiconductor device 2.

As shown in FIG. 27B, the side of the semiconductor device 2 close to the electric control circuit 3 is attached via an adhesive 10 or the like to the pre-mold component 37, and the side of the semiconductor device 2 opposite from the electric control circuit 3 is formed so that parts of the semiconductor device 2 contact the projections 39.

The pre-mold component 37 can be formed of thermosetting resin such as epoxy resin or phenol resin, or of thermoplastic resin such as polycarbonate resin or PBT resin.

According to the present example illustrated in FIG. 28, the projections 39 of the pre-mold component 37 are formed as three semispherical parts, but the present invention is not restricted to such design, and the number of the projections can be any arbitrary number and the cross-sectional shapes of the projections can be any arbitrary shape such as a rectangular shape or a triangle.

[Manufacturing Method]

FIG. 29 shows a manufacturing method for sealing via resin the structure including the semiconductor device 2 mounted on the pre-mold component 37 and the control board 4 shown in FIG. 27 via a mold.

FIG. 29A is a cross-sectional view showing the structure prior to molding of the A-A cross-section of FIG. 27B placed in a mold and subjected to molding.

A mold is used in which an elastic film 21 is disposed on a surface of an upper mold 12 and the semiconductor device 2 is clamped from above and below via the elastic film 21. Further, the dam 28 of the lead frame portion is clamped via the mold so as to prevent resin 11 from flowing out of the mold.

In the example, as shown in FIGS. 27B and 28, the side of the semiconductor device 2 opposite from the electric control circuit 3 is in contact with projections 39 of the pre-mold component 37, so that even when the semiconductor device 2 is clamped by the upper mold 12 via the elastic film 21, the device can be accurately positioned in the mold in the clamping direction.

The B-B cross-section of FIG. 29A is either formed as shown in FIG. 29B or FIG. 29C.

The flow of resin 11 must be blocked by closing the clearance between the semiconductor device 2 and the board 4 in the B-B cross-section so as to prevent resin 11 from flowing into the diaphragm 8 section.

The clearance between the semiconductor device 2 and the board 4 in the B-B cross-section is blocked by disposing an elastic member 15 such as a Teflon block as shown in FIG. 29B or by an insert 16 disposed on the upper mold 12 as shown in FIG. 29C to block the resin 11.

Now, the elastic film 21 can be formed of a polymeric material such as Teflon or fluorine resin, and since the dimension of the elastic film 21 can be varied in the thickness direction, molding can be performed without causing leak of resin 11 or crack of semiconductor device 2 even if the dimension of the semiconductor device 2 is varied.

[Post-Mold Structure]

Figures 30A, 30B:
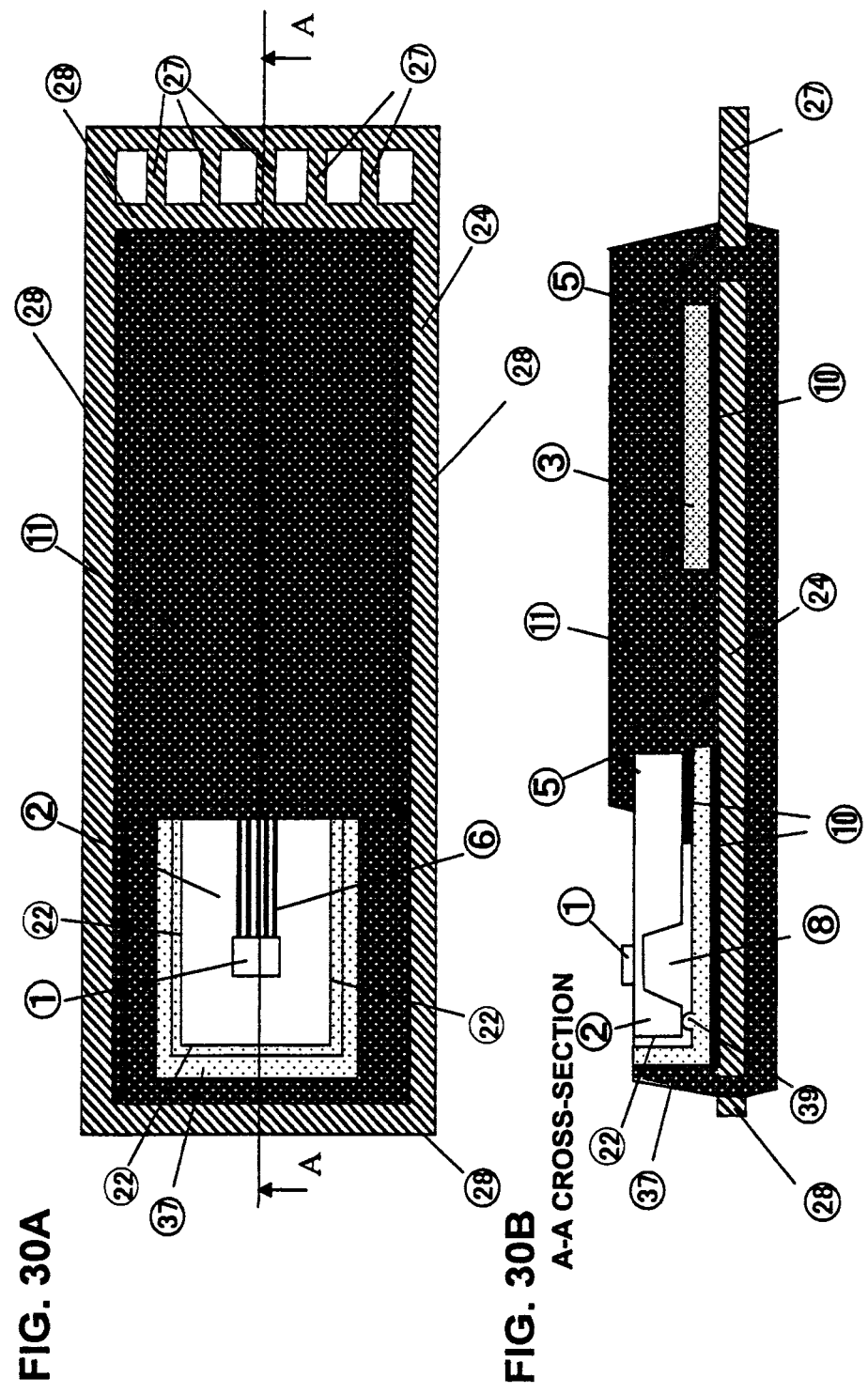
FIG. 30A is a plan view showing the structure including the semiconductor device and the control board prior to molding shown in FIG. 27 molded in the mold shown in FIG. 28.
FIG. 30B is an A-A cross-section of FIG. 30A.

FIG. 30A is a plan view of a structure in which the structure including the semiconductor device 2 and the control board 4 prior to molding shown in FIG. 27 is molded in the mold shown in FIG. 28.

FIG. 30B is an A-A cross-section of FIG. 30A, wherein gold wires 5 for electrically connecting the semiconductor device 2 and the lead frame 24 or the electric control circuit 3 and the lead frame 24 are insulated via a mold resin 11, and the detected flow is output via an electric signal output section.

The post-mold structure as shown in FIG. 30 is used as a flow sensor by cutting away the dam 28 of the lead frame 24 excluding the output terminals 27 as shown in FIGS. 14 and 15, and the detected flow is output via output terminals 27 as electric signals.

The present flow sensor can adopt a structure in which the semiconductor device 2 and the resin 11 mold or the pre-mold component 37 are not in contact with each other excluding the portion where the semiconductor device 2, the gold wires 5 for transmitting electric signals from the semiconductor device 2, the pre-mold component 37 and the lead frame 24 are integrally molded via resin 11.

In other words, the present embodiment provides a flow sensor structure in which three sides 22 of the semiconductor device 2 orthogonal to the surface on which the air flow sensing unit is disposed on the semiconductor device 2 and the pre-mold portion form a continuous space, thereby surrounding the semiconductor device 2.

[Snap-Fit Structure]

The structure including the pre-mold component 37 shown in FIG. 27 adopts a structure in which the pre-mold component 37 and the semiconductor device 2 or the pre-mold component 37 and the lead frame 24 are attached via the adhesive 10, but the present invention is not restricted to such example, and can adopt a structure in which the pre-mold component 37 and the semiconductor device 2 or the pre-mold component 37 and the lead frame 24 are joined via a snap-fit structure 40 disposed on the pre-mold component 37, as shown in FIG. 31.

Figure 31A:
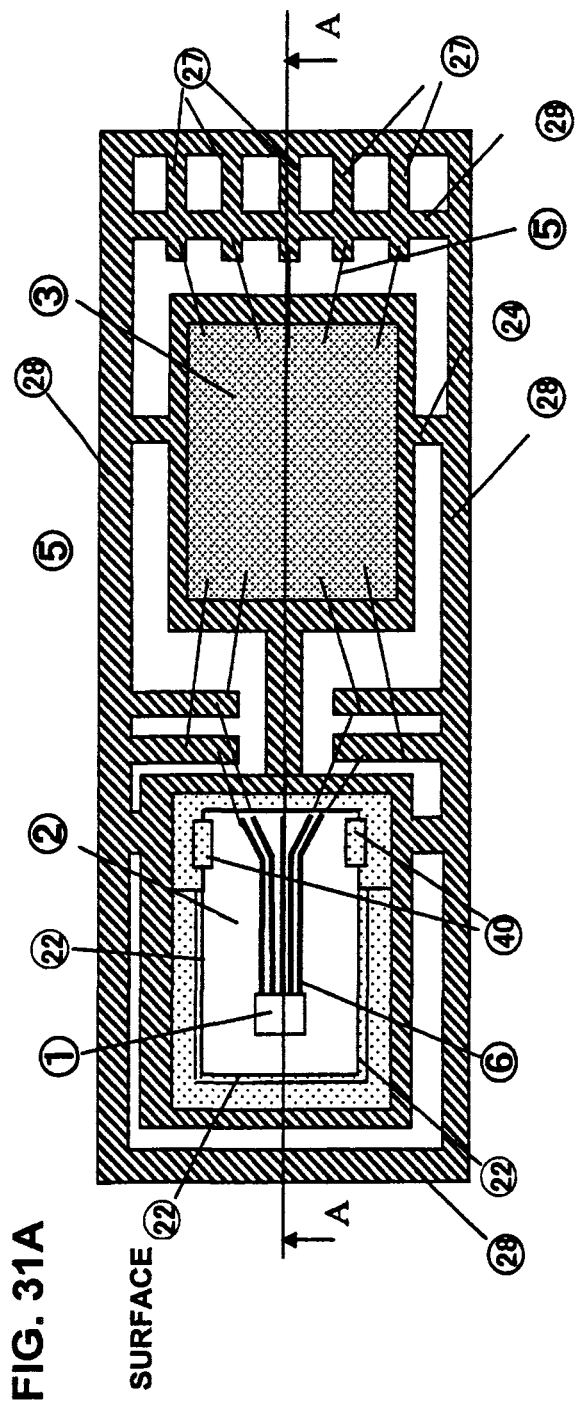
FIG. 31A is a plan view of a surface of a flow sensor prior to molding using a snap-fit structure disposed on the pre-mold component to join the pre-mold component and the semiconductor device or the pre-mold component and the lead frame.
Figure 31B:
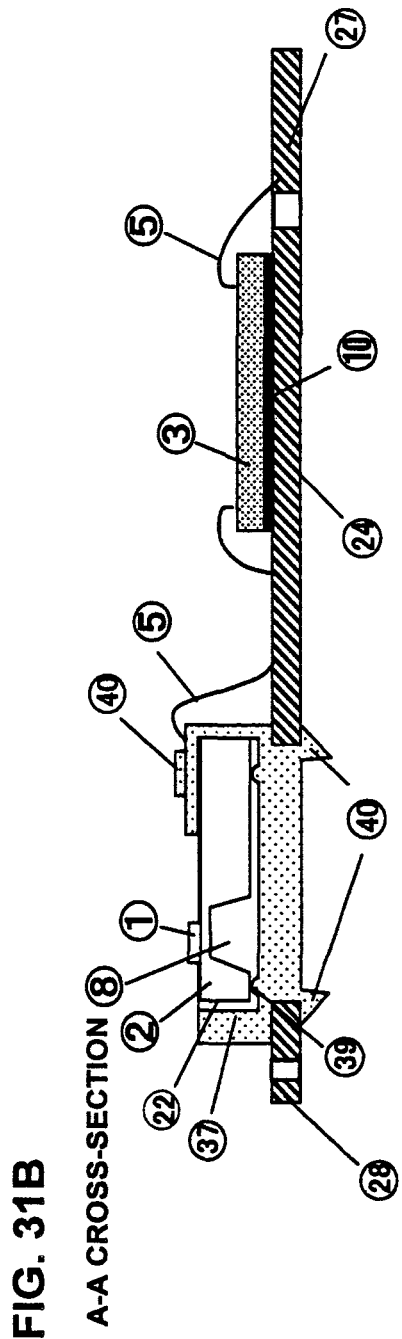
FIG. 31B is an A-A cross-section of FIG. 31A.

FIG. 31A shows a plan view of surface of a flow sensor prior to molding, and FIG. 31B is an A-A cross-section of FIG. 31A.

Now, FIG. 32A shows a plan view of a pre-mold component 37 formed of resin, FIG. 32B is an A-A cross-section of FIG. 32A, and FIG. 32C is a B-B cross-section of FIG. 32A. The pre-mold component 37 comprises a mounting surface 41 of the semiconductor device 2 and sides 42 orthogonal to the mounting surface 41 of the semiconductor device 2, wherein projections 39 are formed at parts of the mounting surface 41 of the semiconductor device 2, constituting a snap-fit 40 for joining the lead frame 24 and the pre-mold component 37 as shown in FIG. 32B or a snap-fit structure 40 for joining the semiconductor device 2 and the pre-mold component 37 as shown in FIG. 32C.

The illustrated embodiments adopt a structure in which the pre-mold component 37 and the semiconductor device 2 or the pre-mold component 37 and the lead frame 24 are joined via an adhesive 10 as shown in FIG. 27 or a structure in which the pre-mold component 37 and the semiconductor device 2 or the pre-mold component 37 and the lead frame 24 are joined via a snap-fit 40 as shown in FIG. 31, but the present invention is not restricted thereto, and can adopt a structure in which the pre-mold component 37 and the semiconductor device 2 or the pre-mold component 37 and the lead frame 24 are joined via press-fitting 43 as shown in FIG. 33.

Figure 33A:
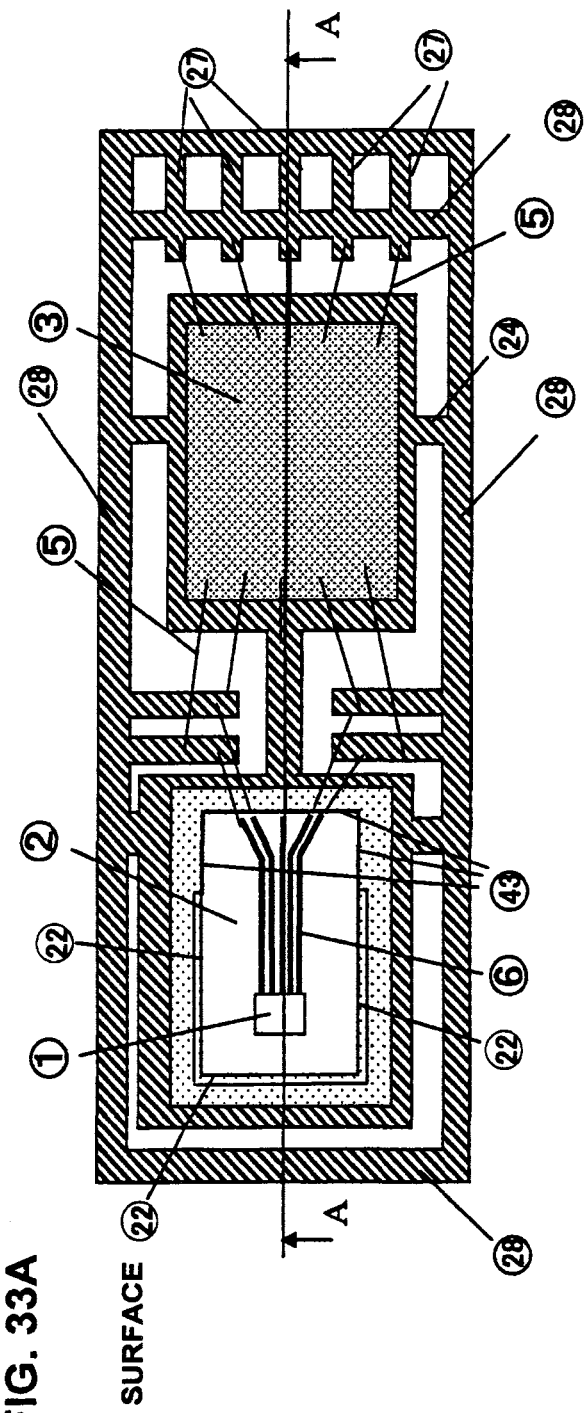
FIG. 33A is a plan view showing the surface of a flow sensor prior to molding in which the pre-mold component and the semiconductor device or the pre-mold component and the lead frame are joined by press-fitting.
Figure 33B:
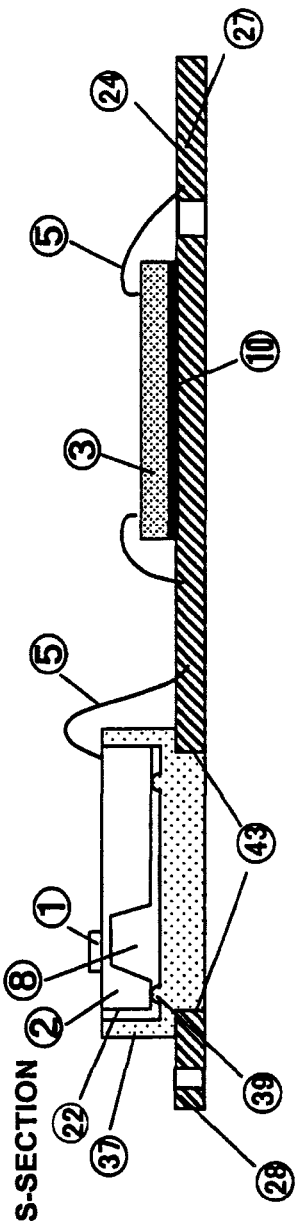
FIG. 33B is an A-A cross-section of FIG. 33A.

Further, FIG. 33A shows a plan view of the surface of a flow sensor prior to molding, and FIG. 33B is an A-A cross-section of FIG. 33A. Moreover, after molding the pre-molding structure shown in FIG. 31 or FIG. 33, the dam 28 of the lead frame 24 other than the output terminals 27 is cut away as shown in FIGS. 14 and 15 to form the flow sensor, wherein the detected flow rate is output as electric signals via the output terminals 27.

The above-described product structures and manufacturing methods related to flow sensors, but the present invention is not restricted to flow sensors, and can be applied to methods for manufacturing components in which a semiconductor device 2 is sealed via resin 11 with a part of the semiconductor device 2 exposed, such as a humidity sensor. Further, it is assumed that the mold used in the manufacturing method of the present embodiments has a draft angle for the mold resin 11, and the mold resin 11 of the product structure also has a draft angle.

What is claimed is:

1. A flow sensor comprising:
   a semiconductor device having an air flow sensing unit and a diaphragm formed thereto;
   a pre-mold component having a surface on which the semiconductor device is disposed and at least three walls disposed in a direction orthogonal to the side on which the semiconductor device is disposed; and
   a lead frame having an electric control circuit for controlling the semiconductor device disposed thereto;
   wherein a part of a surface of the semiconductor device is covered with resin and in direct contact with the resin while having the air flow sensing unit exposed.

2. The flow sensor according to claim 1, wherein
   the pre-mold component has a varied thickness on the surface on which the semiconductor device is disposed, and the semiconductor device is disposed so that a part of the semiconductor device is in contact with a thicker portion of the surface having the varied thickness.

3. The flow sensor according to claim 1, wherein
   a snap-fit structure formed to the pre-mold component is used to join the semiconductor device and the pre-mold component or the lead frame and the pre-mold component.

4. The flow sensor according to claim 1, wherein
   the semiconductor device is press-fit to the pre-mold component or the pre-mold component is press-fit to the lead frame.

5. The flow sensor of claim 1, wherein the part of the surface of the semiconductor device covered with the resin and a portion of the pre-mold component are covered with and in contact with the same resin.

6. A flow sensor comprising:
   a semiconductor device having an air flow sensing unit and a diaphragm formed thereto mounted on a pre-mold component;
   an electronic control circuit which controls the semiconductor device; and
   a lead frame having the semiconductor device and the electronic control circuit mounted thereon;
   wherein the semiconductor device is connected to the pre-mold component, by a part of a region of a side opposite to a side provided with the air flow sensing unit, via an adhesive; and
   wherein a part of a surface of the semiconductor device, excluding the air flow sensing unit, is covered with resin and in direct contact with the resin.

7. The flow sensor according to claim 6, wherein
   the pre-mold component comprises a wall in a direction orthogonal to the side to which the semiconductor device is provided.

8. The flow sensor according to claim 6, wherein
   the pre-mold component is connected to the lead frame via a snap-fit structure, or via the adhesive, or via press-fitting.

9. The flow sensor of claim 6, wherein the part of the surface of the semiconductor device covered with the resin and a portion of the pre-mold component are covered with and in contact with the same resin.

* * * * *